(12) United States Patent
Narita

(10) Patent No.: US 9,239,222 B2
(45) Date of Patent: Jan. 19, 2016

(54) DISPLACEMENT AMOUNT MONITORING ELECTRODE STRUCTURE

(75) Inventor: Katsutoshi Narita, Miyoshi (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 27 days.

(21) Appl. No.: 14/236,966

(22) PCT Filed: Aug. 9, 2011

(86) PCT No.: PCT/JP2011/068177
§ 371 (c)(1),
(2), (4) Date: Feb. 4, 2014

(87) PCT Pub. No.: WO2013/021467
PCT Pub. Date: Feb. 14, 2013

(65) Prior Publication Data
US 2014/0152325 A1 Jun. 5, 2014

(51) Int. Cl.
G01R 27/26 (2006.01)
G01B 7/14 (2006.01)
G01C 19/5733 (2012.01)
B81B 3/00 (2006.01)
G01F 1/78 (2006.01)
G01F 1/80 (2006.01)

(52) U.S. Cl.
CPC .............. *G01B 7/14* (2013.01); *B81B 3/0086* (2013.01); *G01C 19/5733* (2013.01); *B81B 2201/033* (2013.01)

(58) Field of Classification Search
CPC .. B81B 2201/033; B81B 3/0086; G01B 7/14; G01C 19/5733
USPC .............. 324/658–690; 73/861.351, 862.192; 702/47, 52
See application file for complete search history.

(56) References Cited

U.S. PATENT DOCUMENTS

| 5,914,553 A | 6/1999 | Adams | |
| 6,543,285 B2* | 4/2003 | Hashimoto | G01C 19/5719 73/504.14 |
| 8,250,916 B2* | 8/2012 | Jeong | G01C 19/5719 73/504.12 |

(Continued)

FOREIGN PATENT DOCUMENTS

| CN | 102003972 | 4/2011 |
| DE | 10 2007 033001 A1 | 1/2009 |

(Continued)

*Primary Examiner* — Vincent Q Nguyen
*Assistant Examiner* — Raul Rios Russo
(74) *Attorney, Agent, or Firm* — Finnegan, Henderson, Farabow, Garrett & Dunner, LLP

(57) ABSTRACT

The displacement amount monitoring electrode structure includes a fixed electrode and a movable electrode each having a comb-teeth shape including a base part and electrode fingers extending from the base part in a direction parallel to a substrate. The fixed electrode and the movable electrode face each other such that the electrode fingers are meshed together. The fixed electrode is fixed to the substrate and the movable electrode can be displaced in the direction. The displacement amount monitoring electrode structure monitors a displacement amount of a detection mass to be driven at a target amplitude based on a change amount of a capacitance between the fixed electrode and the movable electrode. A change sensitivity of the change amount of the capacitance with respect to a displacement amount of the movable electrode, becomes larger after the displacement of the movable electrode reaches a target amount corresponding to the target amplitude.

6 Claims, 25 Drawing Sheets

(56) References Cited

U.S. PATENT DOCUMENTS

| | | | |
|---|---|---|---|
| 8,943,890 B2 * | 2/2015 | Jeong | G01C 19/5719 73/504.04 |
| 2001/0013253 A1 * | 8/2001 | Hashimoto | 73/504.12 |
| 2006/0006966 A1 | 1/2006 | Kang | |
| 2008/0196500 A1 | 8/2008 | Menard et al. | |
| 2010/0037691 A1 * | 2/2010 | Jeong et al. | 73/504.12 |
| 2011/0050251 A1 | 3/2011 | Franke | |
| 2012/0291546 A1 * | 11/2012 | Jeong et al. | 73/495 |

FOREIGN PATENT DOCUMENTS

| | | |
|---|---|---|
| DE | 10 2009 028924 A1 | 3/2011 |
| JP | 2000-266777 | 9/2000 |
| JP | 2001-227954 | 8/2001 |
| JP | 2004-233088 | 8/2004 |
| JP | 2007-501938 | 2/2007 |
| JP | 2008-170455 | 7/2008 |

* cited by examiner

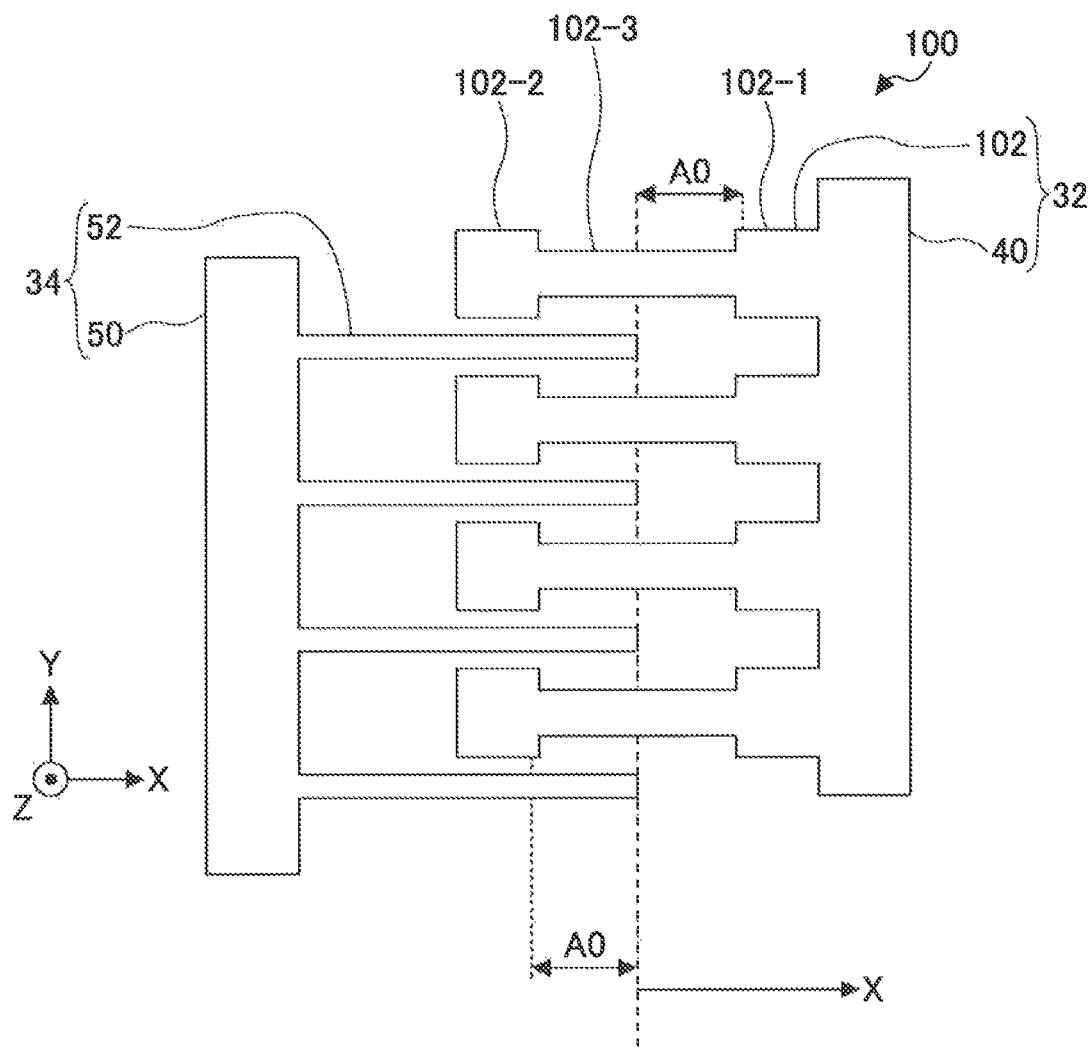

DISPLACEMENT AMOUNT MONITORING ELECTRODE STRUCTURE

CROSS-REFERENCE TO RELATED APPLICATIONS

This application is a national phase application of International Application No. PCT/JP2011/068177, filed Aug. 9, 2011, the content of which is incorporated herein by reference.

TECHNICAL FIELD

The present invention is related to a displacement amount monitoring electrode structure, and particularly to a displacement amount monitoring electrode structure in which a fixed electrode that is fixed to a substrate and a movable electrode that can be displaced in a predetermined axis direction parallel to the substrate, are disposed facing each other such that their respective electrode fingers are meshed together, for monitoring the displacement amount of the detection mass to be driven at a target amplitude based on the change amount of the capacitance between the fixed electrode and the movable electrode.

BACKGROUND ART

Conventionally, there is known a displacement amount monitoring electrode structure constituting an angular speed sensor, for monitoring the displacement amount of a detection mass to drive and oscillate the detection mass at a constant target amplitude (see, for example, Patent Document 1). The displacement amount monitoring electrode includes a comb-teeth like fixed electrode and a comb-teeth like movable electrode. The fixed electrode includes a base part and electrode fingers, which are extending from the base part in a predetermined axis direction parallel to the substrate, and which are fixed to the substrate. The movable electrode includes a base part and electrode fingers, which are extending from the base part in a predetermined axis direction parallel to the substrate, and which can be displaced with respect to the substrate in a predetermined axis direction. In this displacement amount monitoring electrode, when the movable electrode is displaced with respect to the substrate in a predetermined axis direction, the capacitance between the fixed electrode and the movable electrode changes. In this case, the change amount of the capacitance corresponds to the displacement amount of the movable electrode. Based on this change amount of the capacitance, the displacement amount (amplitude) of the detection mass is monitored, and the detection mass is controlled so as to be driven at a target amplitude.

[Patent Document 1] Japanese Laid-open Patent Publication No. 2008-170455

SUMMARY OF INVENTION

Problem to be Solved by Invention

Incidentally, the change amount in the capacitance between the fixed electrode and the movable electrode generally changes linearly according to the amplitude of the detection mass; however, the change amount does not only change according to the amplitude of the detection mass, but also changes according to the gap and the facing area between the fixed electrode and the movable electrode. Specifically, when the gap or the facing area changes due to stress changes and size variations, the sensitivity (slope) of the change amount of the capacitance with respect to the displacement amount of the movable electrode changes, according to the aforementioned change. In this case, in a structure where the change amount of the capacitance is set in a range where the change amount of the capacitance constantly changes linearly at a constant slope with respect to the displacement amount of the movable electrode, in the process where the detection mass is driven at a target amplitude, the following situation arises. That is, when the gap and the facing area between the fixed electrode and the movable electrode do not match desired values due to applied stress, temperature variations, and size variations when assembling the monitoring electrode, when the change amount of the capacitance reaches the target capacitance change amount, the displacement amount of the movable electrode does not match the target displacement amount. Specifically, when the amplitude amount of the detection mass changes, for example, in a range of ±20% using the target amplitude as the standard, due to the above-mentioned variations in the gap and the facing area, the sensitivity in the change amount of the capacitance with respect to the displacement amount of the movable electrode also changes by the same range of ±20%. Therefore, in the above structure, it is difficult to maintain the amplitude of the detection mass at a constant target amplitude.

The present invention has been made in view of the above points, and it is an object to provide a displacement amount monitoring electrode structure by which the amplitude of the detection mass can be maintained at a constant target amplitude, even if the relative relationship between the fixed electrode and the movable electrode changes.

Means to Solve the Problem

The above objective is achieved by a displacement amount monitoring electrode structure including a fixed electrode and a movable electrode each having a comb-teeth shape including a base part and electrode fingers extending from the base part in a predetermined axis direction parallel to a substrate, the fixed electrode and the movable electrode facing each other such that the electrode fingers of the fixed electrode and the electrode fingers of the movable electrode are meshed together, the fixed electrode being fixed to the substrate and the movable electrode being able to be displaced in the predetermined axis direction, wherein the displacement amount monitoring electrode structure monitors a displacement amount of a detection mass to be driven at a target amplitude based on a change amount of a capacitance between the fixed electrode and the movable electrode, wherein a change sensitivity of the change amount of the capacitance with respect to a displacement amount of the movable electrode in the predetermined axis direction, has a characteristic of increasing after the displacement of the movable electrode in the predetermined axis direction reaches a target displacement amount corresponding to the target amplitude, compared to before the displacement of the movable electrode reaches the target displacement amount.

Effects of the Invention

According to the present invention, the amplitude of the detection mass can be maintained at a constant target amplitude even when the relative relationship between a fixed electrode and a movable electrode changes.

BRIEF DESCRIPTION OF DRAWINGS

FIG. 10 is a top view of a displacement amount monitoring electrode according to a second embodiment of the present invention;

MODE FOR CARRYING OUT THE INVENTION

In the following, a specific embodiment of a displacement amount monitoring electrode structure according to the present invention is described, with reference to drawings.

First Embodiment

Figure 1:
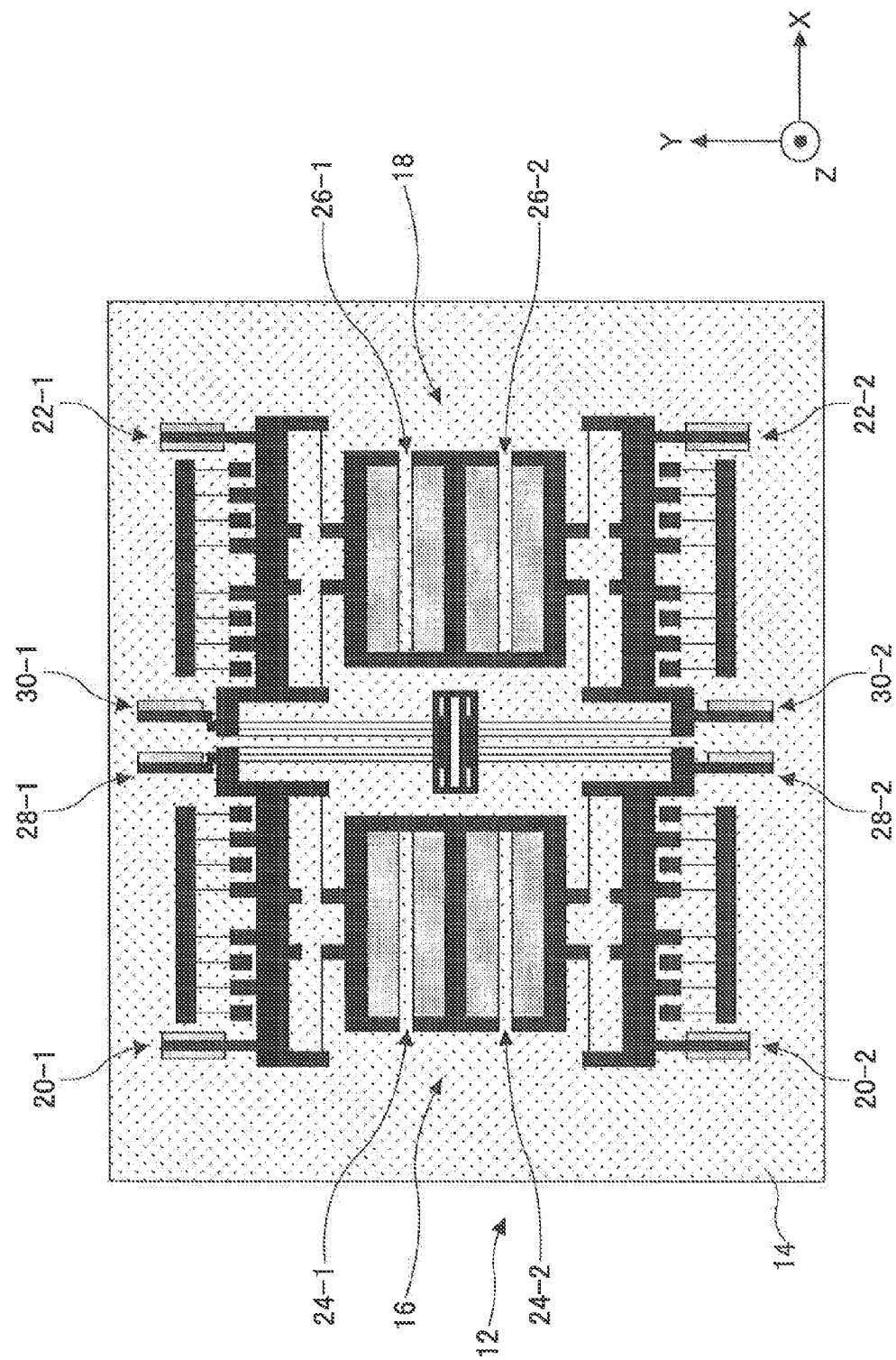
FIG. 1 illustrates a configuration of a sensor using a structure of a displacement amount monitoring electrode according to a first embodiment of the present invention.

FIG. 1 illustrates a configuration of a sensor 12 using a structure of a displacement amount monitoring electrode 10 according to a first embodiment of the present invention. The sensor 12 according to the present embodiment is an angular speed sensor installed in a vehicle, for example, for detecting the angular speed occurring around a Z-axis perpendicular to an X-Y plane. The sensor 12 is formed on a semiconductor substrate 14 made of, for example, silicon, and is formed by performing etching on the surface of the semiconductor substrate 14 by minute processing.

The sensor 12 includes a pair of structure bodies 16, 18 being equal in mass, driving electrodes 20-1, 20-2, 22-1, 22-2 for exciting/driving the structure bodies 16, 18 in an X-axis direction on the semiconductor substrate 14, detection electrodes 24-1, 24-2, 26-1, 26-2 for detecting the oscillation (amplitude) in the Y-axis direction occurring in the structure bodies 16, 18 on the semiconductor substrate 14, and displacement amount monitoring electrodes 28-1, 28-2, 30-1, 30-2 for monitoring the drive displacement amount in the X-axis direction of the structure bodies 16, 18 on the semiconductor substrate 14. The structure bodies 16, 18 are disposed at mutually symmetrical positions on the semiconductor substrate 14 in a state where the structure bodies 16, 18 are lifted at a predetermined distance from the surface of the semiconductor substrate 14 forming an insulating layer. In the following, the displacement amount monitoring electrodes 28-1, 28-2, 30-1, 30-2 are referred to as the "displacement amount monitoring electrodes" 10 when referred to collectively.

The driving electrodes 20-1, 20-2, 22-1, 22-2 and the detection electrodes 24-1, 24-2, 26-1, 26-2 are each constituted by a fixed electrode fixed to the semiconductor substrate 14 and a movable electrode movable in an X-axis direction or a Y-axis direction with respect to the semiconductor substrate 14. These fixed electrodes are connected to a signal processing circuit via a pad. Furthermore, these movable electrodes constitute a part of the structure bodies 16, 18.

The driving electrodes 20-1, 20-2, 22-1, 22-2 are electrodes respectively for driving the structure bodies 16, 18 in the X-axis direction with respect to the semiconductor substrate 14, by activating an electrostatic attractive force between the fixed electrode and the movable electrode by applying a driving voltage to the fixed electrode. Furthermore, the detection electrodes 24-1, 24-2, 26-1, 26-2 are respectively electrodes for detecting the oscillation of the structure bodies 16, 18 in the Y-axis direction with respect to the semiconductor substrate 14, by detecting the change in the capacitance between the fixed electrode and the movable electrode caused by the displacement of the structure bodies 16, 18 in the Y-axis direction.

Specifically, in each of the driving electrodes 20-1, 20-2, 22-1, 22-2, a driving voltage, which has substantially the same frequency as the resonance frequency of the structure bodies 16, 18, is applied to the fixed electrode from the signal processing circuit via a pad, so that an electrostatic attractive force is activated between the fixed electrode and the movable electrode, and a driving force is generated for exciting the structure bodies 16, 18 at a constant amplitude in the X-axis direction at a frequency substantially equal to the resonance frequency of the structure bodies 16, 18. Note that the driving electrode 20-1 and the driving electrode 20-2 generate a driving force by the same phase and the driving electrode 22-1 and the driving electrode 22-2 generate a driving force by the same phase, while the driving electrodes 20-1, 20-2 and the driving electrodes 22-1, 22-2 generate a driving force by opposite phases.

Furthermore, in each of the detection electrodes 24-1, 24-2, 26-1, 26-2, a change in the capacitance occurs between the fixed electrode and the movable electrode, according to a displacement in the oscillation applied to the structure bodies 16, 18 in the Y-axis direction with respect to the semiconductor substrate 14. Note that the change in the capacitance in the detection electrodes 24-1, 24-2 and the change in the capacitance in the detection electrodes 26-1, 26-2 are of opposite phases. The change in the capacitance of the detection electrodes 24-1, 24-2, 26-1, 26-2 is substantially zero when the oscillation displacement amount of the structure bodies 16, 18 in the Y-axis direction is zero, and increases as the oscillation displacement amount of the structure bodies 16, 18 in the Y-axis direction increases. The fixed electrode of each of the detection electrodes 24-1, 24-2, 26-1, 26-2 outputs, to the signal processing circuit, the change amount of the capacitance between the fixed electrode and the movable electrode, as a displacement detection signal. The signal processing circuit processes the displacement detection signal from each of the detection electrodes 24-1, 24-2, 26-1, 26-2 to detect the oscillation displacement amount of the structure bodies 16, 18 in the Y-axis direction, and detect the angular speed generated around the Z-axis based on the oscillation displacement amount.

Next, a description is given of the operation of the sensor 12 according to the present embodiment.

When detecting the angular speed around the Z-axis that is orthogonal to both the X-axis and the Y-axis, in the sensor 12, the driving electrodes 20-1, 20-2, 22-1, 22-2 are excited. Specifically, a driving voltage having a frequency that is substantially equal to the resonance frequency of the structure bodies 16, 18, is applied to the fixed electrode of the driving electrodes 20-1, 20-2, 22-1, 22-2. When this driving voltage is applied, in each of the driving electrodes 20-1, 20-2, 22-1, 22-2, a driving force for exciting the structure bodies 16, 18 in the X-axis direction is generated between the fixed electrode and the movable electrode, so that the structure bodies 16, 18 are excited by opposite phases at a constant amplitude in the X-axis direction by a frequency substantially equal to the resonance frequency.

In a case where an angular speed around the Z-axis is not generated in a state where the structure bodies 16, 18 are excited in the X-axis direction as described above, a Coriolis force is not activated at the structure bodies 16, 18. In this case, the detection electrodes 24-1, 24-2, 26-1, 26-2 are not oscillated/displaced in the Y-axis direction, and a change of the capacitance does not occur between the fixed electrode and the movable electrode of the detection electrodes 24-1, 24-2, 26-1, 26-2, and therefore the displacement detection signal output from the detection electrodes 24-1, 24-2, 26-1, 26-2 becomes a signal expressing that the amplitude of the structure bodies 16, 18 in the Y-axis direction is substantially zero.

Meanwhile, when an angular speed around the Z-axis is generated in a state where the structure bodies 16, 18 are excited in the X-axis direction as described above, a Coriolis force is activated at the structure bodies 16, 18. In this case, the detection electrodes 24-1, 24-2, 26-1, 26-2 are oscillated/displaced in the Y-axis direction according to the activation of the Coriolis force, and a change in the capacitance occurs between the fixed electrode and the movable electrode of the detection electrodes 24-1, 24-2, 26-1, 26-2. When such a change in the capacitance occurs, the displacement detection signal output from the detection electrodes 24-1, 24-2, 26-1, 26-2 becomes a signal expressing the extent of the angular speed of the amplitude generated at the structure bodies 16, 18 in the Y-axis direction. When a Coriolis force is activated, the structure bodies 16, 18 are oscillated/displaced in opposite phases with each other with respect to the Y-axis direction. Therefore, with the sensor 12, the angular speed occurring at the target around the Z-axis can be detected.

Figure 2:
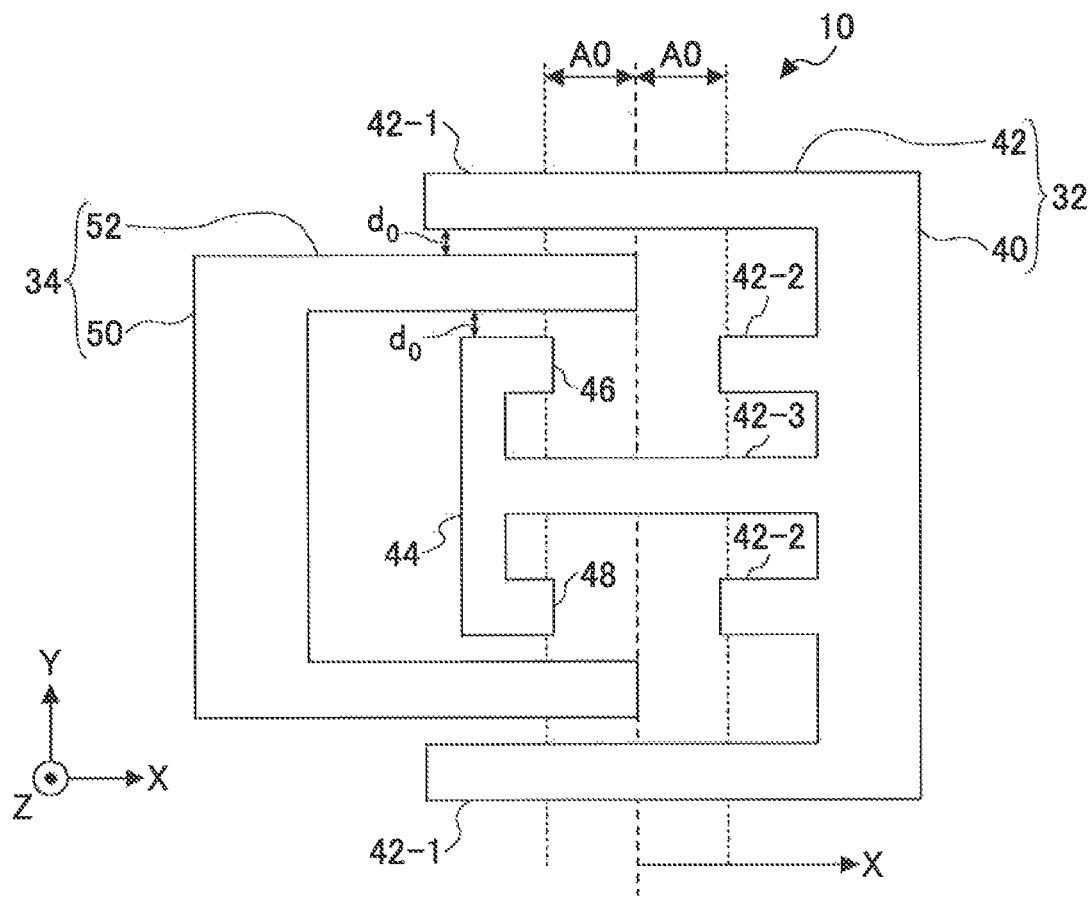
FIG. 2 is a top view of the displacement amount monitoring electrode according to the first embodiment of the present invention.
Figure 3:
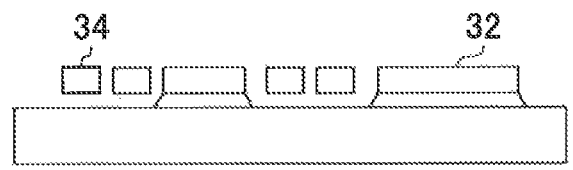
FIG. 3 is a cross-sectional view of the displacement amount monitoring electrode according to the first embodiment of the present invention.

FIG. 2 is a top view of the displacement amount monitoring electrode 10 according to the present embodiment. Furthermore, FIG. 3 is a cross-sectional view of the displacement amount monitoring electrode 10 according to the present embodiment.

The displacement amount monitoring electrodes 10 as the displacement amount monitoring electrodes 28-1, 28-2, 30-1, 30-2 are each constituted by a fixed electrode 32 fixed to the semiconductor substrate 14 and a movable electrode 34 movable in the X-axis direction with respect to the semiconductor substrate 14. The fixed electrode 32 is connected to the signal processing circuit via a pad. Furthermore, the movable electrode 34 constitutes part of the structure bodies 16, 18. The displacement amount monitoring electrode 10 is an electrode for detecting the change in the capacitance between the fixed electrode 32 and the movable electrode 34 caused by the displacement of the structure bodies 16, 18 in the X-axis direction, to monitor the drive displacement amount (amplitude) of the structure bodies 16, 18 in the X-axis direction with respect to the semiconductor substrate 14.

The fixed electrode 32 is formed to have a comb-teeth shape, and includes a base part 40 provided to have a relatively wide width, and electrode fingers 42 extending from the base part 40 in a stick-shape in an X-axis direction parallel to the semiconductor substrate 14. The base part 40 is formed to have a square cross-sectional shape, and is extending in a Y-axis direction parallel to the semiconductor substrate 14. Furthermore, there are a plurality of electrode fingers 42 arranged in a Y-axis direction parallel to each other, with respect to a single base part 40. The electrode fingers 42 include a long electrode finger 42-1 having a relatively long length in the X-axis direction, a short electrode finger 42-2 having a relatively short length in the X-axis direction, and a T-shaped electrode finger 42-3 having a relatively long length in the X-axis direction and whose leading end spreads out in the shape of wings in the Y-axis direction.

Each of the long electrode finger 42-1 and the short electrode finger 42-2 of the electrode fingers 42 is formed to have a square cross-sectional shape and has the same cross-sectional area from the connection part with the base part 40 to the leading end (the same width in the Y-axis direction and the same thickness in the Z-axis direction). Furthermore, the T-shaped electrode finger 42-3 is formed to have a square cross-sectional shape and has the same cross-sectional area from the connection part with the base part 40 to a part near the leading end (the same width in the Y-axis direction and the same thickness in the Z-axis direction). The T-shaped electrode finger 42-3 has a leading end part 44 extending in the Y-axis direction. On both ends in the Y-axis direction of the leading end part 44 of the T-shaped electrode finger 42-3, protrusion parts 46, 48 are provided, which extend in an X-axis direction parallel to the semiconductor substrate 14 from the leading end part 44 toward the base part 40 side. That is to say, the leading end part 44 is formed to have a U-shape as viewed from the top. The protrusion parts 46, 48 have the same cross-sectional area from the connection part with the leading end part 44 to the leading end (the same width in the Y-axis direction and the same thickness in the Z-axis direction), and have the same cross-sectional area as that of the short electrode finger 42-2 described above.

The electrode fingers 42 are formed as a pattern in which one long electrode finger 42-1, two short electrode fingers 42-2, and one T-shaped electrode finger 42-3 constitute one set. Specifically, as illustrated in FIG. 2, the long electrode finger 42-1, the short electrode finger 42-2, the T-shaped electrode finger 42-3, and the short electrode finger 42-2 are provided in the stated order in the Y-axis direction, and this configuration is repeated in the Y-axis direction. The electrode fingers 42 have a bilaterally symmetric configuration in which one of each of the short electrode finger 42-2 and the long electrode finger 42-1 are disposed in the stated order on either side of one T-shaped electrode finger 42-3.

In the electrode fingers 42, a predetermined gap is formed in the Y-axis direction between the long electrode finger 42-1 and the short electrode finger 42-2. Furthermore, a predetermined gap is formed in the Y-axis direction between the short electrode finger 42-2 and the T-shaped electrode finger 42-3. Note that the gap between the long electrode finger 42-1 and the short electrode finger 42-2, and the predetermined gap in the Y-axis direction between the short electrode finger 42-2 and the T-shaped electrode finger 42-3 may be different. Furthermore, the positions in the Y-axis direction of the protrusion parts 46, 48 of the leading end part 44 of the T-shaped electrode finger 42-3 are the same as the positions in the Y-axis direction of the short electrode fingers 42-2. That is to say, the protrusion parts 46, 48 are disposed to be spaced apart by a predetermined distance in the X-axis direction from the short electrode fingers 42-2. Between the protrusion parts 46, 48 and the short electrode fingers 42-2, there is a predetermined gap formed in the X-axis direction. The protrusion parts 46, 48 and the short electrode fingers 42-2 constitute electrode fingers having cutouts which are holes formed by the predetermined gaps.

Meanwhile, the movable electrode 34 is formed to have a comb-teeth shape, and includes a base part 50 provided to have a relatively wide width, and electrode fingers 52 extending from the base part 50 in a stick-shape in an X-axis direction parallel to the semiconductor substrate 14. The base part 50 is formed to have a square cross-sectional shape, and is extending in a Y-axis direction parallel to the semiconductor substrate 14. Furthermore, each of the electrode fingers 52 is formed to have a square cross-sectional shape and has the same cross-sectional area from the connection part with the base part 50 to the leading end (the same width in the Y-axis direction and the same thickness in the Z-axis direction). There are a plurality of electrode fingers 52 arranged in the Y-axis direction parallel to each other, with respect to a single base part 50.

The fixed electrode 32 and the movable electrode 34 are disposed such that the base parts 40, 50 face each other in the X-axis direction and the electrode fingers 42, 52 face each other and are meshed together in the Y-axis direction. Specifically, the electrode fingers 52 of the movable electrode 34 are disposed so as to enter the center position in the Y-axis direction between the long electrode finger 42-1 and the short electrode finger 42-2 among the electrode fingers 42 of the fixed electrode 32. A predetermined gap d0 is formed in the Y-axis direction, between the electrode finger 52 of the movable electrode 34 and the long electrode finger 42-1 of the fixed electrode 32 adjacent to each other in the Y-axis direction, between the electrode finger 52 of the movable electrode 34 and the short electrode finger 42-2 of the fixed electrode 32 that may be adjacent to each other in the Y-axis direction, and between the electrode finger 52 of the movable electrode 34 and the protrusion parts 46, 48 of the leading end part 44 of the T-shaped electrode finger 42-3 of the fixed electrode 32 adjacent to each other in the Y-axis direction.

The electrode fingers 52 of the movable electrode 34 are constituted such that the leading ends are positioned, in the X-axis direction, at the center of the gap between the leading ends of the protrusion parts 46, 48 of the fixed electrode 32 and the leading ends of the short electrode fingers 42-2, at the oscillation center (i.e., displacement center of the movable electrode 34) of the structure bodies 16, 18. Furthermore, the gap in the X-axis direction between the leading ends of the protrusion parts 46, 48 and the leading ends of the short electrode fingers 42-2 is set to be the same as a value that is two times a target amplitude (i.e., a target displacement amount from the oscillation center of the leading end of the movable electrode 34 corresponding to the target amplitude) A0 of the structure bodies 16, 18, or slightly smaller than this value.

Note that a thickness (i.e., the height at a part where the side wall of the electrode fingers 42 and the side wall of the electrode fingers 52 face each other in the Z-axis direction) Tm at a part where the electrode fingers 42 of the fixed electrode 32 and the electrode fingers 52 of the movable electrode 34 adjacent to each other in the Y-axis direction overlap in the thickness direction, i.e., the Z-axis direction, may be different from the thickness of the electrode fingers 42 in the Z-axis direction or the thickness of the electrode fingers 52 in the Z-axis direction, or may match these thicknesses.

In the displacement amount monitoring electrode 10 having the above structure, when the structure bodies 16, 18 are excited in the X-axis direction, the movable electrode 34 is displaced in the X-axis direction due to the excitation. In this case, a change in the capacitance occurs between the fixed electrode 32 and the movable electrode 34 due to the displacement of the movable electrode 34. Note that the change in the capacitance at the displacement amount monitoring electrodes 28-1, 28-2 and the change in the capacitance at the displacement amount monitoring electrodes 30-1, 30-2 are of opposite phases from each other. The change in the capacitance of the displacement amount monitoring electrode 10 increases, as the driving displacement amount of the structure bodies 16, 18 in the X-axis direction increases.

Each of the fixed electrodes of the displacement amount monitoring electrode 10 outputs, to the signal processing circuit, the change in the capacitance between the fixed electrode 32 and the movable electrode 34 as drive displacement amount monitor signals. The signal processing circuit monitors the drive displacement amount of the structure bodies 16, 18 in the X-axis direction by processing the drive displacement amount monitor signals from the displacement amount monitoring electrodes 10. Then, based on the drive displacement amount, the drive voltage to be applied to the driving electrodes 20-1, 20-2, 22-1, 22-2 is controlled so that the structure bodies 16, 18 are exited in the X-axis direction at a constant amplitude.

Incidentally, in order to precisely detect the angular speed around the Z-axis in the sensor 12, the amplitude by which the structure bodies 16, 18 acting as a detection mass are exited in the X-axis direction need to be always maintained at a constant level. Furthermore, in order to maintain the driving amplitude of the structure bodies 16, 18 in the X-axis direction at a constant level, the capacitance change amount between the fixed electrode 32 and the movable electrode 34 of the displacement amount monitoring electrode 10 is generally maintained at a constant level. Therefore, it is appropriate to control the driving voltage applied to the driving electrodes 20-1, 20-2 so that the capacitance change amount is maintained at a constant level; specifically, it is appropriate to perform drive control such that the drive displacement amount of the structure bodies 16, 18 reaches the target displacement amount (target amplitude) at the time point when the above capacitance change amount reaches the target capacitance change amount.

Figure 4:
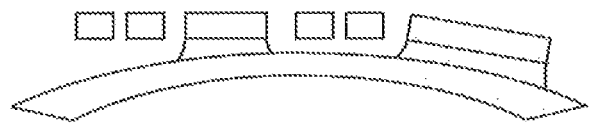
FIG. 4 is a cross-sectional view of the displacement amount monitoring electrode in the case where deformation has occurred due to stress changes.
Figure 5:
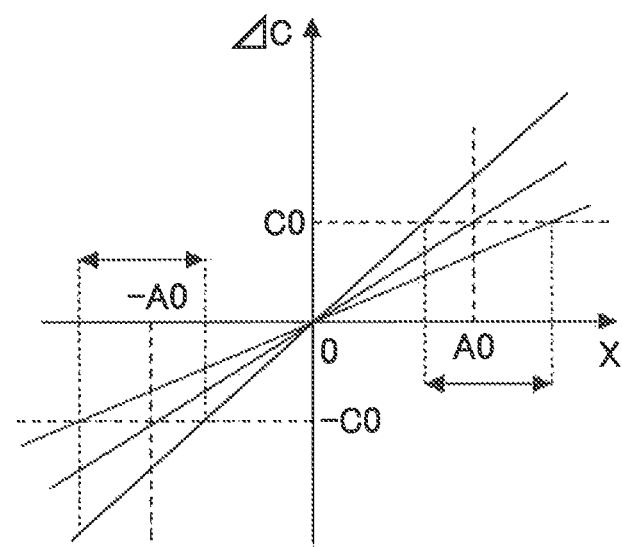
FIG. 5 illustrates the relationship between the drive displacement amount x of the movable electrode that changes according to size variations in the displacement amount monitoring electrode, and a capacitance change amount AC between the fixed electrode and the movable electrode.

FIG. 4 is a cross-sectional view of the displacement amount monitoring electrode 10 in the case where deformation has occurred due to stress changes. Furthermore, FIG. 5 illustrates the relationship (slope) between the drive displacement amount x of the structure bodies 16, 18, i.e., the movable electrode 34, that changes according to stress changes and size variations in the displacement amount monitoring electrode 10, and a capacitance change amount ΔC between the fixed electrode 32 and the movable electrode 34.

Note that when the movable electrode 34 is not moving in the X-axis direction, the drive displacement amount x of the leading ends of the electrode fingers 52 of the movable electrode 34 is set as "0", the side to which the leading ends of the electrode fingers 52 come close to the base part 40 of the fixed electrode 32 is set as x>0, and the side from which the leading ends of the electrode fingers 52 go away from the base part 40 of the fixed electrode 32 is set as x<0. Furthermore, the capacitance change amount AC between the fixed electrode 32 and the movable electrode 34 is a value using the capacitance, when the drive displacement amount is x=0, as a standard; the capacitance change amount ΔC of the side on which the facing area of the fixed electrode 32 and the movable electrode 34 increases is set as ΔC>0, and the capacitance change amount ΔC of the side on which the facing area decreases is set as ΔC <0.

The capacitance change amount ΔC between the fixed electrode 32 and the movable electrode 34 does not only change according to the drive displacement amount x of the structure bodies 16, 18, but also changes according to the gap and the facing area between the fixed electrode 32 and the movable electrode 34. That is to say, the relationship between the drive displacement amount x and the capacitance change amount ΔC described above changes according to the gap and the facing area described above. When the area where the fixed electrode 32 and the movable electrode 34 face each other changes proportionally according to the displacement of the movable electrode 34, the capacitance change amount AC between the fixed electrode 32 and the movable electrode 34 changes linearly with respect to the drive displacement amount x of the movable electrode 34. In this case, when the gap and the facing area between the fixed electrode 32 and the movable electrode 34 largely deviate from the desired values due to stress changes and size variations of the displacement amount monitoring electrode 10, as illustrated in FIG. 5, the drive displacement amount x of the movable electrode 34 largely deviates from the target displacement amount A0, −A0 when the capacitance change amount ΔC reaches the target capacitance change amount C0, −C0. Therefore, it is difficult to maintain the amplitude of the structure bodies 16, 18 at a constant target amplitude.

Figure 6:
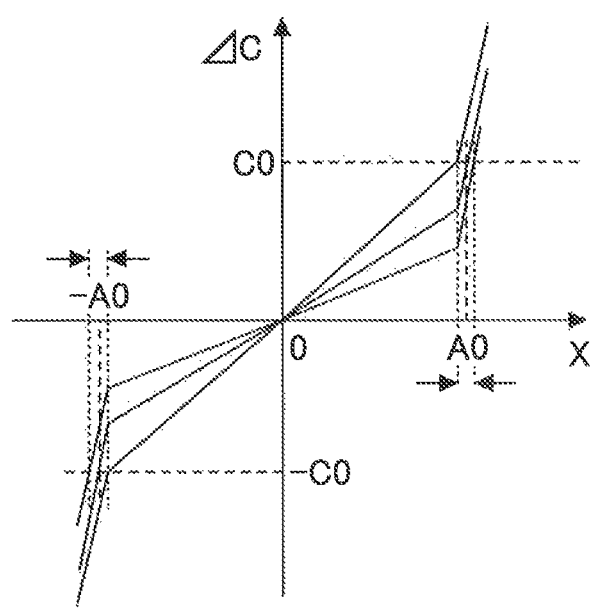
FIG. 6 illustrates the relationship between the drive displacement amount x of the movable electrode and the capacitance change amount AC between the fixed electrode and the movable electrode, in the displacement amount monitoring electrode according to the first embodiment of the present invention.
Figure 7:
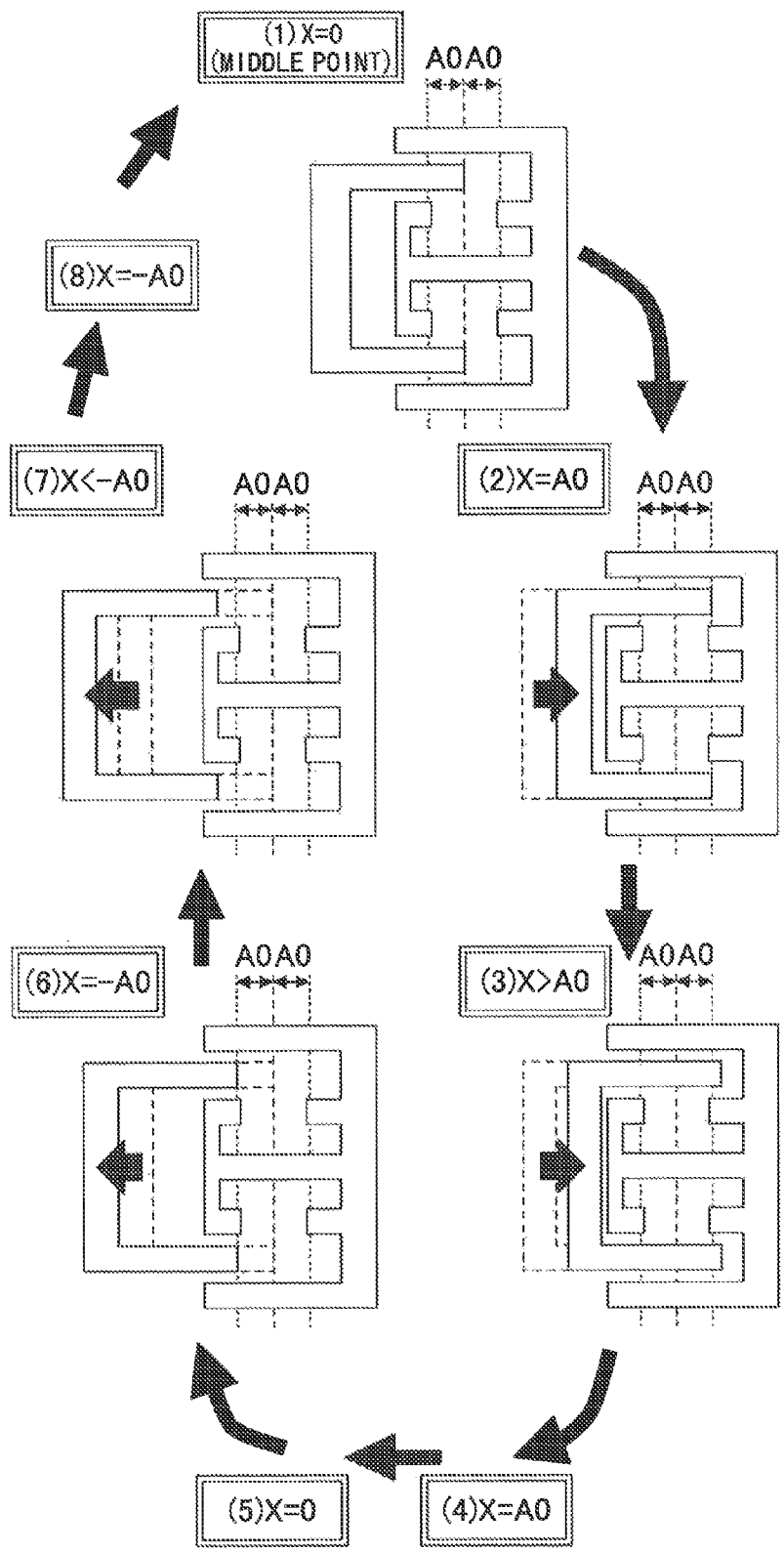
FIG. 7 illustrates the operation procedures of the displacement amount monitoring electrode according to the first embodiment of the present invention.

FIG. 6 illustrates the relationship between the drive displacement amount x of the structure bodies 16, 18, i.e., the movable electrode 34 and the capacitance change amount ΔC between the fixed electrode 32 and the movable electrode 34, in the displacement amount monitoring electrode 10 according to the present embodiment. Furthermore, FIG. 7 illustrates the operation procedures of the displacement amount monitoring electrode 10 according to the present embodiment.

In the displacement amount monitoring electrode 10 according to the present embodiment, the capacitance change amount ΔC between the fixed electrode 32 and the movable electrode 34 is calculated according to the following formula (1). It is assumed that the vacuum dielectric constant is ∈0, the relative permittivity of the space between the fixed electrode 32 and the movable electrode 34 is ∈r, the number of facing electrodes in the displacement amount monitoring electrode 10 is Nm, and the gap between the fixed electrode 32 and the movable electrode 34 in the Y-axis direction is dm.

$$\Delta C = \in 0 \cdot \in r \cdot 2 \cdot Tm \cdot Nm \cdot x / dm \qquad (1)$$

In the present embodiment, as described above, the electrode fingers 52 of the movable electrode 34 enters the center position in the Y-axis direction between the long electrode finger 42-1 and the short electrode finger 42-2 among the electrode fingers 42 of the fixed electrode 32, and the leading ends of the electrode fingers 52 are positioned, in the X-axis direction, at the center of the gap between the leading ends of the protrusion parts 46, 48 of the fixed electrode 32 and the leading ends of the short electrode fingers 42-2, at the oscillation center of the structure bodies 16, 18. Furthermore, between the electrode fingers 52 of the movable electrode 34 and the long electrode finger 42-1 of the electrode fingers 42 of the fixed electrode 32, a predetermined gap d0 is formed in the Y-axis direction. Furthermore, the gap between the leading ends of the protrusion parts 46, 48 of the fixed electrode 32 described above and the leading end of the short electrode finger 42-2 is set to be the same as a value that is two times a target amplitude A0 of the structure bodies 16, 18, or slightly smaller than this value.

In the above structure, in the process (first process) from when the movable electrode 34 is driven/displaced from a position (x=0) where the drive displacement amount x is zero to a position (x=A0) where the drive displacement amount x is the target displacement amount A0, in the fixed electrode 32 that is spaced apart from the movable electrode 34 by a gap d0 in the Y-axis direction, only the long electrode finger 42-1 among the electrode fingers 42 contributes to the increase in the facing area of the fixed electrode 32 and the movable electrode 34. In this case, the area where the fixed electrode 32 and the movable electrode 34 face each other with a gap d0 therebetween, increases proportionally according to the displacement of the movable electrode 34. Therefore, in the above first process, the capacitance change amount ΔC between the fixed electrode 32 and the movable electrode 34 increases at a constant slope.

Furthermore, in the process (second process) from when the movable electrode 34 is driven/displaced from a position (x=A0) where the drive displacement amount x is the target displacement amount A0 further to the x>A0 side, in the fixed electrode 32 that is spaced apart from the movable electrode 34 by a gap d0 in the Y-axis direction, the long electrode finger 42-1 and the short electrode finger 42-2 among the electrode fingers 42 contribute to the increase in the facing area of the fixed electrode 32 and the movable electrode 34. In this case, the area where the fixed electrode 32 and the movable electrode 34 face each other with a gap d0 therebetween, increases proportionally according to the displacement of the movable electrode 34, and also the increase in slope of the area is greater than the increase in slope in the first process described above. Therefore, in the second process described above, the capacitance change amount ΔC between the fixed electrode 32 and the movable electrode 34 increases by a greater slope compared to the slope of the first process described above.

Furthermore, in the process (third process) from when the movable electrode 34 is driven/displaced from the position of x>A0 to the position of x=A0, in the fixed electrode 32 that is spaced apart from the movable electrode 34 by a gap d0 in the Y-axis direction, the long electrode finger 42-1 and the short electrode finger 42-2 among the electrode fingers 42 contribute to the decrease in the facing area of the fixed electrode 32 and the movable electrode 34. In this case, the area where the fixed electrode 32 and the movable electrode 34 face each other with a gap d0 therebetween, decreases proportionally according to the displacement of the movable electrode 34. Therefore, in the third process described above, the capacitance change amount ΔC between the fixed electrode 32 and the movable electrode 34 decreases by the same slope as that of the second process described above.

Furthermore, in the process (fourth process) from when the movable electrode 34 is driven/displaced from the position of x=A0 to the position of x=0, and in the process (fifth process) from when the movable electrode 34 is driven/displaced from the position of x=0 to the position of x=−A0, in the fixed electrode 32 that is spaced apart from the movable electrode 34 by a gap d0 in the Y-axis direction, only the long electrode finger 42-1 among the electrode fingers 42 contributes to the decrease in the facing area of the fixed electrode 32 and the movable electrode 34. In this case, the area where the fixed electrode 32 and the movable electrode 34 face each other with a gap d0 therebetween, decreases proportionally according to the displacement of the movable electrode 34, and the decrease in slope of the area is smaller than the decrease in slope of the third process described above. Therefore, in the fourth and fifth processes described above, the capacitance change amount ΔC between the fixed electrode 32 and the movable electrode 34 decreases by a smaller slope compared to the slope in the third process described above.

Furthermore, in the process (sixth process) from when the movable electrode 34 is driven/displaced from a position (x=−A0) where the drive displacement amount x is the target displacement amount −A0 further to the x<−A0 side, in the fixed electrode 32 that is spaced apart from the movable electrode 34 by a gap d0 in the Y-axis direction, the long electrode finger 42-1 and the protrusion parts 46, 48 of the T-shaped electrode fingers 42-3 among the electrode fingers 42 contribute to the decrease in the facing area of the fixed electrode 32 and the movable electrode 34. In this case, the area where the fixed electrode 32 and the movable electrode 34 face each other with a gap d0 therebetween, decreases proportionally according to the displacement of the movable electrode 34, and also the decrease in slope of the area is greater than the decrease in slope in the fourth and fifth processes described above. Therefore, in the sixth process described above, the capacitance change amount ΔC between the fixed electrode 32 and the movable electrode 34 decreases by a greater slope compared to the slope of the fourth and fifth processes described above.

Furthermore, in the process (seventh process) from when the movable electrode 34 is driven/displaced from the position of x<−A0 to the position of x=−A0, in the fixed electrode 32 that is spaced apart from the movable electrode 34 by a gap d0 in the Y-axis direction, the long electrode finger 42-1 and the short electrode finger 42-2 among the electrode fingers 42 contribute to the increase in the facing area of the fixed electrode 32 and the movable electrode 34. In this case, the area where the fixed electrode 32 and the movable electrode 34 face each other with a gap d0 therebetween, increases proportionally according to the displacement of the movable electrode 34. Therefore, in the seventh process described above, the capacitance change amount ΔC between the fixed electrode 32 and the movable electrode 34 increases by the same slope as that of the sixth process described above.

Furthermore, in the process (eighth process) from when the movable electrode 34 is driven/displaced from the position of x=−A0 to the position of x=0, in the fixed electrode 32 that is spaced apart from the movable electrode 34 by a gap d0 in the Y-axis direction, only the long electrode finger 42-1 among the electrode fingers 42 contributes to the increase in the facing area of the fixed electrode 32 and the movable electrode 34. In this case, the area where the fixed electrode 32 and the movable electrode 34 face each other with a gap d0 therebetween, increases proportionally according to the displacement of the movable electrode 34, and the increase in slope of the area is greater than the increase in slope of the seventh process described above. Therefore, in the eighth process described above, the capacitance change amount ΔC between the fixed electrode 32 and the movable electrode 34 increases by a smaller slope compared to the slope in the seventh process described above.

As described above, the structure of the displacement amount monitoring electrode 10 has features that when the drive displacement amount x of the movable electrode 34 is between the target displacement amounts −A0 and A0, the change sensitivity of the capacitance change amount ΔC between the fixed electrode 32 and the movable electrode 34 with respect to the drive displacement amount x of the movable electrode 34 in the X-axis direction is relatively small, while when the drive displacement amount x of the movable electrode 34 satisfies x<−A0 or x>A0, the change sensitivity is relatively large.

That is to say, the structure of the displacement amount monitoring electrode 10 has features that the change sensitivity of the capacitance change amount ΔC described above becomes higher after the drive displacement of the movable electrode 34 reaches the target displacement amount A0 compared to that before the drive displacement of the movable electrode 34 reaches the target displacement amount A0, and the change sensitivity becomes higher after the drive displacement of the movable electrode 34 reaches the target displacement amount −A0 compared to that before the drive displacement of the movable electrode 34 reaches the target displacement amount −A0. Specifically, the fixed electrode 32 and the movable electrode 34 (particularly, the fixed electrode 32) are formed, such that the change sensitivity of the total area of the surfaces of the electrode fingers 42, 52 facing each other with a gap d0 therebetween becomes higher after the drive displacement of the movable electrode 34 reaches the target displacement amount A0 compared to that before the drive displacement of the movable electrode 34 reaches the target displacement amount A0, and the change sensitivity becomes higher after the drive displacement of the movable electrode 34 reaches the target displacement amount −A0 compared to that before the drive displacement of the movable electrode 34 reaches the target displacement amount −A0. That is to say, the fixed electrode 32 and the movable electrode 34 (particularly, the fixed electrode 32) are formed, such that the number of parts where the electrode fingers 42, 52 face each other with a gap d0 therebetween increases after the drive displacement of the movable electrode 34 reaches the target displacement amount A0 compared to that before the drive displacement of the movable electrode 34 reaches the target displacement amount A0, and the number of the parts increases after the drive displacement of the movable electrode 34 reaches the target displacement amount −A0 compared to that before the drive displacement of the movable electrode 34 reaches the target displacement amount −A0.

Therefore, in the structure of the displacement amount monitoring electrode 10, the change sensitivity of the capacitance change amount ΔC between the fixed electrode 32 and the movable electrode 34 with respect to the drive displacement amount x of the movable electrode 34 after the movable electrode 34 is driven/displaced to the target displacement amount A0, −A0, is higher compared to that when the movable electrode 34 is positioned between the target displacement amounts −A0 and A0. According to the above structure, compared to the structure where the change sensitivity of the capacitance change amount ΔC is constant, it is possible to reduce the variations in the drive displacement amount x of the movable electrode 34 when the capacitance change amount ΔC between the fixed electrode 32 and the movable electrode 34 reaches the target capacitance change amount C0, which variations are caused when the slope of the capacitance change amount ΔC between the fixed electrode 32 and the movable electrode 34 changes with respect to the drive displacement amount x of the movable electrode 34 according to changes in the gap and the facing area between the fixed electrode 32 and the movable electrode 34.

Therefore, according to the structure of the displacement amount monitoring electrode 10 of the present embodiment, even when the relative relationship such as the gap and the facing area between the fixed electrode 32 and the movable electrode 34 changes, it is possible to prevent the drive displacement amount x of the movable electrode 34 from largely deviating from the target displacement amount A0 when the capacitance change amount ΔC reaches the target capacitance change amount C0. Therefore, it is possible to maintain the amplitude of the structure bodies 16, 18 to a constant target amplitude as much as possible. By this point, it is possible to increase the robustness with respect to disturbance factors such as assembly stress and temperature changes and manufacturing factors such as size variations, so that the yield can be improved and the ratio of non-defective products can be increased.

Furthermore, in the displacement amount monitoring electrode 10 according to the present embodiment, in increasing the change sensitivity of the capacitance change amount ΔC between the fixed electrode 32 and the movable electrode 34 with respect to the drive displacement amount x of the movable electrode 34 after the movable electrode 34 is driven/displaced to the target displacement amount A0, −A0, it is unnecessary to reduce the gap between the leading ends of the electrode fingers 42 of the fixed electrode 32 and the movable electrode 34 and the base part 50, or the gap between the base part 40 and the leading ends of the electrode fingers 52, and a margin can be left in these gaps. Therefore, in the process of driving the structure bodies 16, 18 in the X-axis direction, the fixed electrode 32 and the movable electrode 34 can be prevented from colliding with each other, so that the displacement amount monitoring electrode 10 can be prevented from breaking.

Note that in the first embodiment described above, the structure bodies 16, 18 correspond to the "detection mass" in the claims, and the X direction corresponds to the "predetermined axis direction" in the claims.

Figure 8A:
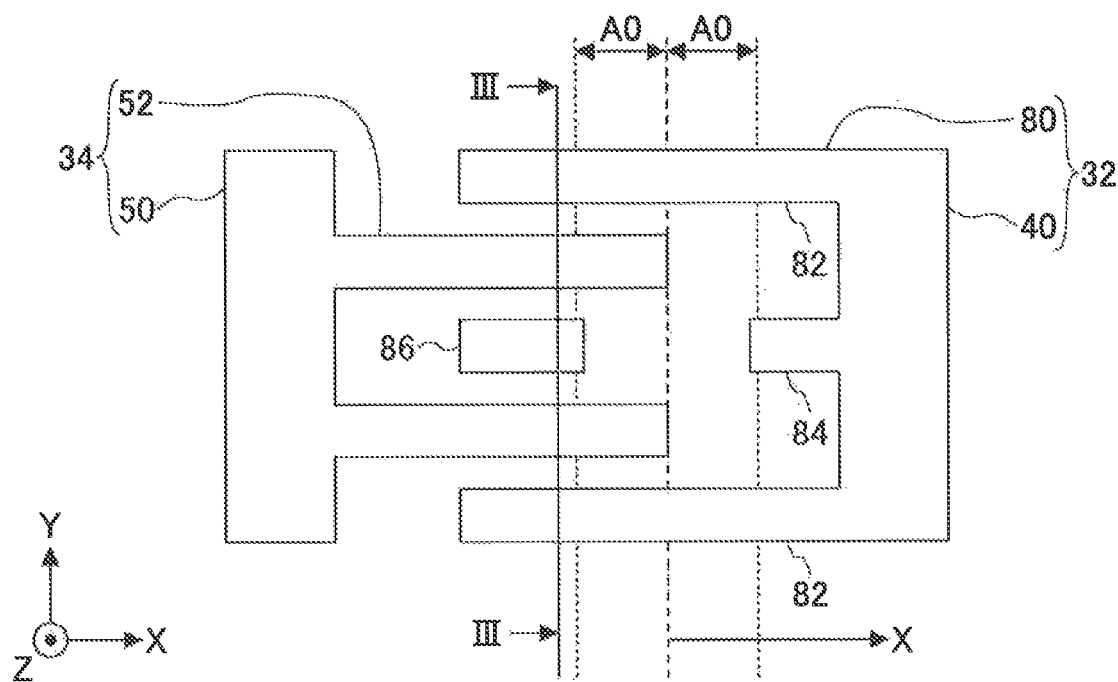
FIG. 8A is a top view of a displacement amount monitoring electrode according to a modification example of the first embodiment of the present invention.
Figure 9A:
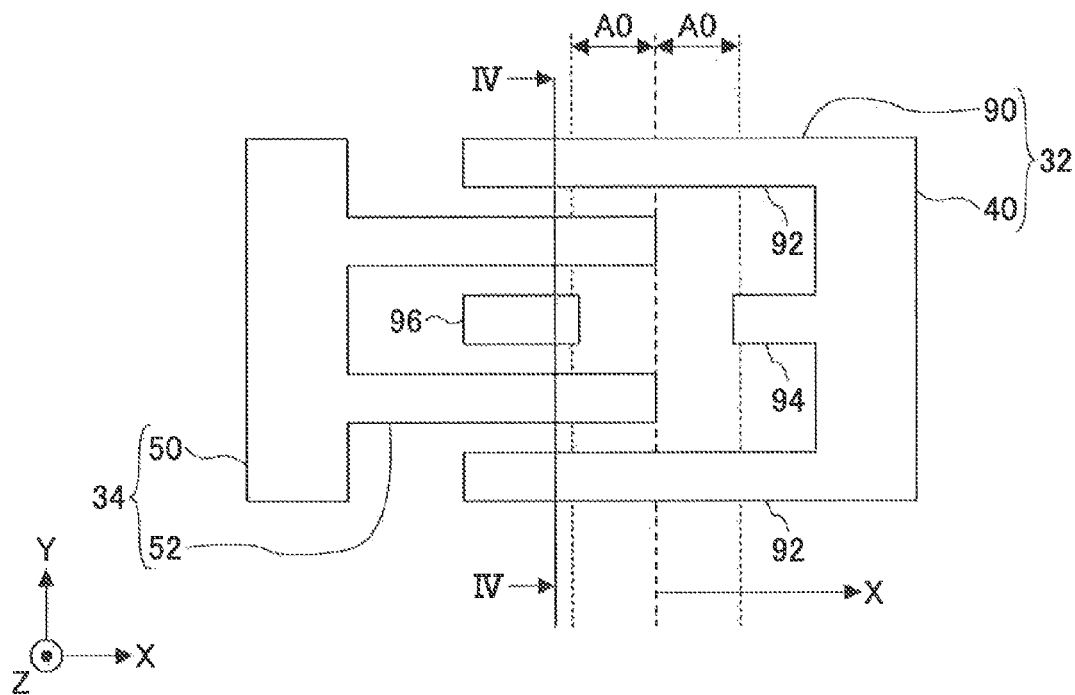
FIG. 9A is a top view of a displacement amount monitoring electrode according to a modification example of the first embodiment of the present invention.

Incidentally, in the first embodiment described above, the fixed electrode 32 includes the electrode fingers 42 that extend from the base part 40 in an X-axis direction parallel to the semiconductor substrate 14, and the electrode fingers 42 are constituted by three types of electrode fingers, the long electrode finger 42-1, the short electrode finger 42-2, and the T-shaped electrode finger 42-3; however, the present invention is not so limited. As illustrated in FIG. 8A and FIG. 9A, the fixed electrode 32 may include electrode fingers 80, 90 extending from the base part 40 in an X-axis direction parallel to the semiconductor substrate 14, and the electrode fingers 80, 90 may be constituted by two types of electrode fingers, i.e., long electrode fingers 82, 92 having a relatively long length in the X-axis direction and short electrode fingers 84, 94 having a relatively short length in the X-axis direction.

In the structure of this modification example, the long electrode fingers 82, 92 and the short electrode fingers 84, 94 of the fixed electrode 32 are formed to have a square cross-sectional shape, and have the same cross-sectional area from the connection part with the base part 40 to the leading end (the same width in the Y-axis direction and the same thickness in the Z-axis direction). The electrode fingers 80, 90 are formed as a pattern in which one long electrode finger 82, 92 and one short electrode finger 84, 94 constitute one set. Specifically, the long electrode fingers 82, 92, and the short electrode fingers 84, 94 are provided in the stated order in the Y-axis direction, and this configuration is repeated in the Y-axis direction. In the electrode fingers 80, 90, a predetermined gap is formed in the Y-axis direction between the long electrode fingers 82, 92 and the short electrode fingers 84, 94.

Furthermore, the fixed electrode 32 includes, as part of the electrode fingers 80, 90, separate parts 86, 96 that are not connected to the base part 40. The separate parts 86, 96 extend in an X-axis direction parallel to the semiconductor substrate 14 and are formed to have a square cross-sectional shape, and have the same cross-sectional shape between both ends in the X-axis direction (the same width in the Y-axis direction and the same thickness in the Z-axis direction). The positions of the separate parts 86, 96 in the Y-axis direction are the same as the positions of the short electrode fingers 84, 94 in the Y-axis direction. That is to say, the separate parts 86, 96 are disposed to be spaced apart from the short electrode fingers 84, 94 by a predetermined distance in the X-axis direction. Between the separate parts 86, 96 and the short electrode fingers 84, 94, there is formed a predetermined gap in the X-axis direction. The separate parts 86, 96 and the short electrode fingers 84, 94 constitute electrode fingers including cutouts which are holes formed by the predetermined gaps.

Figure 8B:
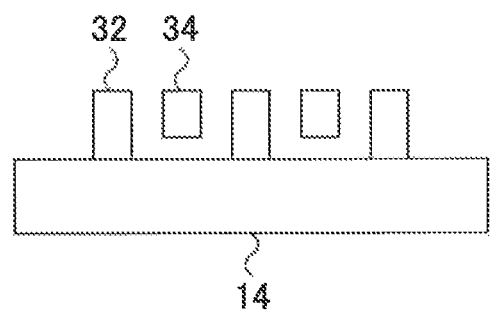
FIG. 8B is a cross-sectional view cut along III-III of the displacement amount monitoring electrode illustrated in FIG. 8A.
Figure 9B:
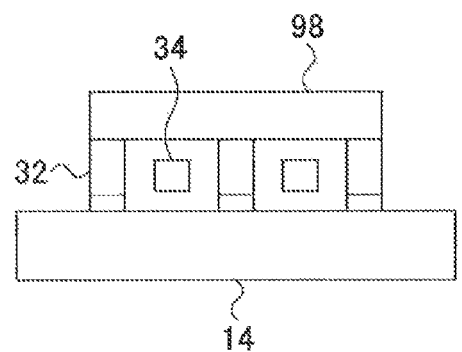
FIG. 9B is a cross-sectional view cut along IV-IV of the displacement amount monitoring electrode illustrated in FIG. 9A.

Note that the separate part 86 may be maintained at the same potential as the other parts of the fixed electrode 32 (for example, the long electrode finger 82, the short electrode finger 84, etc.) by having the entire fixed electrode 32 electrically connected to the semiconductor substrate 14 as illustrated in FIG. 8B, and furthermore, the separate part 96 may be maintained at the same potential as the other parts of the fixed electrode 32 (for example, the long electrode finger 92, the short electrode finger 94, etc.) by having the separate part 96 be electrically connected to the long electrode finger 92 via a top electrode 98 as illustrated in FIG. 9B.

The fixed electrode 32 and the movable electrode 34 are disposed such that the base parts 40, 50 face each other in the X-axis direction and the electrode fingers 80, 90 and the electrode fingers 52 face each other and are meshed together in the Y-axis direction. Specifically, the electrode fingers 52 of the movable electrode 34 are disposed so as to enter the center position in the Y-axis direction between the long electrode fingers 82, 92 and the short electrode fingers 84, 94 among the electrode fingers 80, 90 of the fixed electrode 32. A predetermined gap d0 is formed in the Y-axis direction, between the electrode finger 52 of the movable electrode 34 and the long electrode fingers 82, 92 of the fixed electrode 32 adjacent to each other in the Y-axis direction, between the electrode finger 52 of the movable electrode 34 and the short electrode fingers 84, 94 of the fixed electrode 32 that may be adjacent to each other in the Y-axis direction, and between the electrode finger 52 of the movable electrode 34 and the separate parts 86, 96 of the fixed electrode 32 adjacent to each other in the Y-axis direction.

The electrode fingers 52 of the movable electrode 34 are constituted such that the leading ends are positioned, in the X-axis direction, at the center of the gap between one end of the separate parts 86, 96 of the fixed electrode 32 and the leading ends of the short electrode fingers 84, 94, at the oscillation center (i.e., displacement center of the movable electrode 34) of the structure bodies 16, 18. Furthermore, the gap in the X-axis direction between one end of the separate parts 86, 96 and the leading ends of the short electrode fingers 84, 94 is set to be the same as a value that is two times a target amplitude (i.e., a target displacement amount from the oscillation center of the leading end of the movable electrode 34 corresponding to the target oscillation) A0 of the structure bodies 16, 18, or slightly smaller than this value.

Note that a thickness (i.e., the height at a part where the side wall of the electrode fingers 80, 90 and the side wall of the electrode fingers 52 face each other in the Z-axis direction) Tm at a part where the electrode fingers 80, 90 of the fixed electrode 32 and the electrode fingers 52 of the movable electrode 34 adjacent to each other in the Y-axis direction overlap in the thickness direction, i.e., the Z-axis direction, may be different from the thickness of the electrode fingers 80, 90 in the Z-axis direction or the thickness of the electrode fingers 52 in the Z-axis direction, or may match these thicknesses.

The structure of the displacement amount monitoring electrode 10 according to the modification example also has features that when the drive displacement amount x of the movable electrode 34 is between the target displacement amounts −A0 and A0, the change sensitivity of the capacitance change amount ΔC between the fixed electrode 32 and the movable electrode 34 with respect to the drive displacement amount x of the movable electrode 34 in the X-axis direction is relatively small, while when the drive displacement amount x of the movable electrode 34 satisfies x<−A0 or x>A0, the change sensitivity is relatively large. That is to say, the displacement amount monitoring electrode 10 has a feature that the change sensitivity of the capacitance change amount ΔC described above is larger after the drive displacement of the movable electrode 34 reaches the target displacement amount A0, −A0, compared to before the drive displacement reaches the target displacement amount A0, −A0. Specifically, the fixed electrode 32 and the movable electrode 34 are formed such that the change sensitivity of the total area of the area where the electrode fingers 80, 90 and the electrode fingers 52 face each other with a gap d0 therebetween becomes larger after the drive displacement of the movable electrode 34 reaches the target displacement amount A0, −A0, compared to before the drive displacement reaches the target displacement amount A0, −A0; that is to say, the fixed electrode 32 is formed such that the number of parts where the electrode fingers 80, 90 and the electrode fingers 52 face each other with a gap d0 therebetween increases after the drive displacement of the movable electrode 34 reaches the target displacement amount A0, −A0, compared to that before the drive displacement of the movable electrode 34 reaches the target displacement amount A0, −A0. Therefore, also in the structure of this modification example, the same affects as the structure of the first embodiment described above can be attained.

Furthermore, in the structure of this modification example, the gap where the electrode fingers 80, 90 of the fixed electrode 32 and the electrode fingers 52 of the movable electrode 34 face each other in the Y-axis direction can be at equal intervals at all parts, and therefore the configuration can be made compact compared to a structure in which the gap is unequal at the respective parts, and the area occupied by the displacement amount monitoring electrode 10 on the semiconductor substrate 14 can be prevented from increasing.

Second Embodiment

Figure 11:
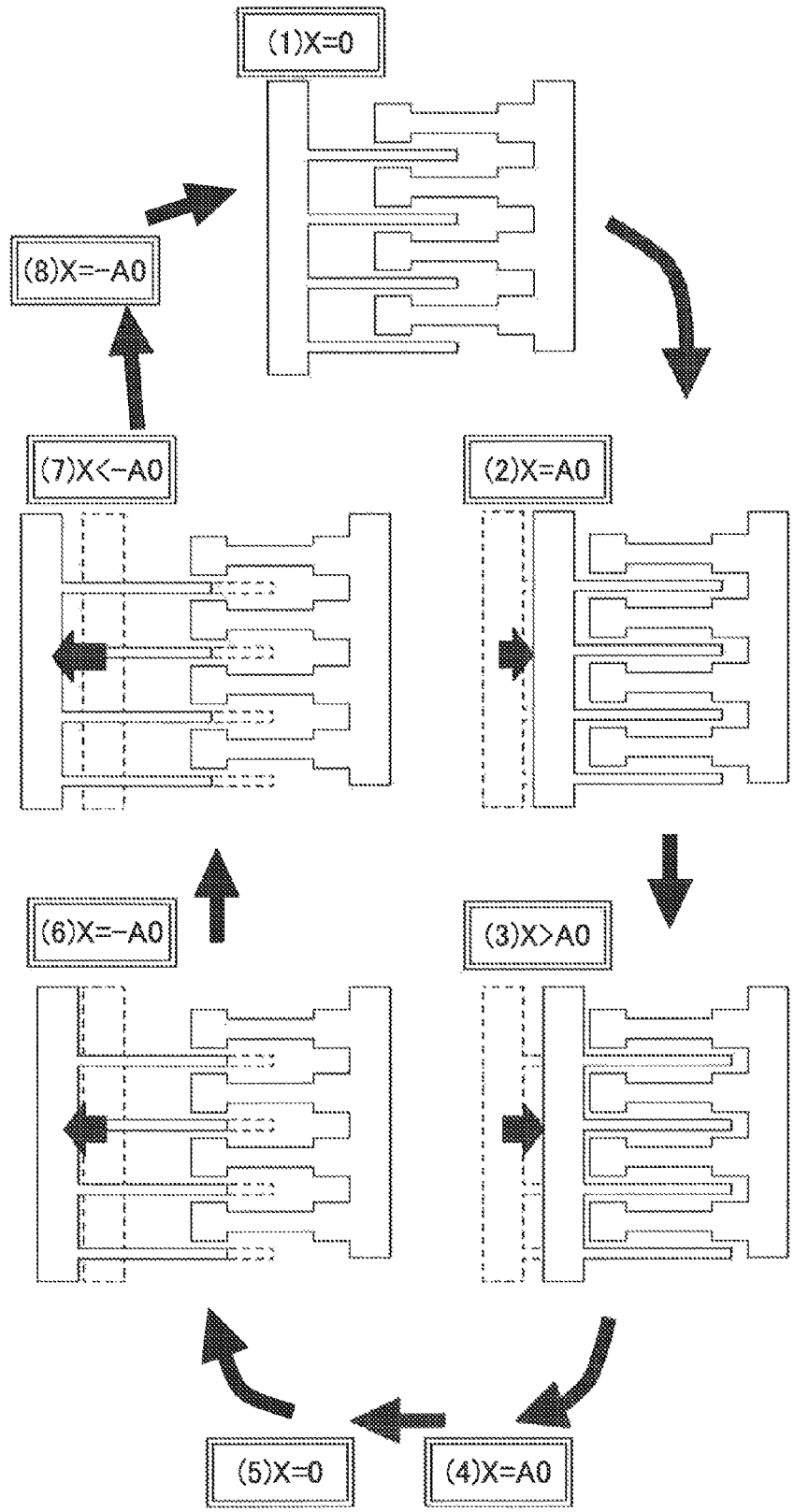
FIG. 11 illustrates operation procedures in the displacement amount monitoring electrode according to the second embodiment of the present invention.

FIG. 10 is a top view of a displacement amount monitoring electrode 100 according to a second embodiment of the present invention. Note that in FIG. 10, the same elements as those of the configuration illustrated in FIG. 2 described above are denoted by the same reference numerals and descriptions thereof are omitted or simplified. Furthermore, FIG. 11 illustrates operation procedures in the displacement amount monitoring electrode 100 according to the present embodiment.

The displacement amount monitoring electrode 100 according to the present embodiment includes the fixed electrode 32 and the movable electrode 34. The fixed electrode 32 is formed to have a comb-teeth shape, and includes electrode fingers 102 extending from the base part 40 in an X-axis direction parallel to the semiconductor substrate 14. There are a plurality of electrode fingers 102 arranged at equal intervals in a Y-axis direction parallel with each other, with respect to a single base part 40. The electrode fingers 102 have the same shape. Each of the electrode fingers 102 has a square cross-sectional shape, and is constituted so that the cross-sectional area changes from the connection part with the base part 40 to the leading end.

Specifically, in each of the electrode fingers 102, the width in the Y-axis direction near the connection part with the base part 40 and at the part near the leading end is greater than the width in the Y-axis direction at a part in the middle of the these parts. Accordingly, the cross-sectional area near the connection part with the base part 40 and the part near the leading end is greater than the cross-sectional area at a part in the middle of the these parts. In the following, in the electrode finger 102, the part near the connection part with the base part 40 where the cross-sectional area is relatively large is referred to as a root part 102-1, the part near the leading end where the cross-sectional area is relatively large is referred to as a leading end part 102-2, and the part in the middle where the cross-sectional area is relatively small is referred to as a middle part 102-3.

The fixed electrode 32 and the movable electrode 34 are disposed such that the base parts 40, 50 face each other in the X-axis direction and the electrode fingers 102 and the electrode fingers 52 face each other and are meshed together in the Y-axis direction. Specifically, the electrode fingers 52 of the movable electrode 34 are disposed so as to enter the center position between two electrode fingers 102 adjacent to each other in the Y-axis direction of the fixed electrode 32. The electrode fingers 52 of the movable electrode 34 and the electrode fingers 102 of the fixed electrode 32 adjacent to each other in the Y-axis direction are constituted so that different gaps dm are formed in the Y-axis direction according to the parts; specifically, the gap between the electrode finger 52 and the root part 102-1 and the gap between the electrode finger 52 and the leading end part 102-2 are relatively small, and the gap between the electrode finger 52 and the middle part 102-3 is relatively large.

The electrode fingers 52 of the movable electrode 34 are constituted such that the leading ends are positioned, in the X-axis direction, at the center of the middle part 102-3 of the electrode fingers 102 of the fixed electrode 32 in the X-axis direction, at the oscillation center (i.e., displacement center of the movable electrode 34) of the structure bodies 16, 18. Furthermore, the length of the middle part 102-3 in the X-axis direction, i.e., the distance in the X-axis direction between the root part 102-1 and the leading end part 102-2, is set to be the same as a value that is two times a target amplitude (i.e., a target displacement amount from the oscillation center of the leading end of the movable electrode 34 corresponding to the target amplitude) A0 of the structure bodies 16, 18, or slightly smaller than this value.

Note that a thickness (i.e., the height at a part where the side wall of the electrode fingers 102 and the side wall of the electrode fingers 52 face each other in the Z-axis direction) Tm at a part where the electrode fingers 102 of the fixed electrode 32 and the electrode fingers 52 of the movable electrode 34 adjacent to each other in the Y-axis direction overlap in the thickness direction, i.e., the Z-axis direction, may be different from the thickness of the electrode fingers 102 in the Z-axis direction or the thickness of the electrode fingers 52 in the Z-axis direction, or may match these thicknesses.

In the structure of the displacement amount monitoring electrode 100, in the process (first process) from when the movable electrode 34 is driven/displaced from a position (x=0) where the drive displacement amount x is zero to a position (x=A0) where the drive displacement amount x is the target displacement amount A0, in the fixed electrode 32 facing the movable electrode 34, the middle part 102-3 among the electrode fingers 102 contributes to the increase in the facing area of the fixed electrode 32 and the movable electrode 34. In this case, the gap dm in the Y-axis direction between the electrode finger 102 of the fixed electrode 32 and the electrode finger 52 of the movable electrode 34 is a relatively large constant value. Therefore, in the above first process, the capacitance change amount $\Delta C$ between the fixed electrode 32 and the movable electrode 34 increases at a constant slope.

Furthermore, in the process (second process) from when the movable electrode 34 is driven/displaced from a position (x=A0) where the drive displacement amount x is the target displacement amount A0 further to the x>A0 side, in the fixed electrode 32 facing the movable electrode 34, the root part 102-1 among the electrode fingers 102 contributes to the increase in the facing area of the fixed electrode 32 and the movable electrode 34. In this case, the gap dm in the Y-axis direction between the electrode finger 102 of the fixed electrode 32 and the electrode finger 52 of the movable electrode 34 is a relatively small constant value. Therefore, in the second process described above, the capacitance change amount $\Delta C$ between the fixed electrode 32 and the movable electrode 34 increases by a greater slope compared to the slope of the first process described above.

Furthermore, in the process (third process) from when the movable electrode 34 is driven/displaced from the position of x>A0 to the position of x=A0, in the fixed electrode 32 facing the movable electrode 34, the root part 102-1 among the electrode fingers 102 contributes to the decrease in the facing area of the fixed electrode 32 and the movable electrode 34. In this case, the gap dm in the Y-axis direction between the electrode finger 102 of the fixed electrode 32 and the electrode finger 52 of the movable electrode 34 is a relatively small constant value. Therefore, in the third process described above, the capacitance change amount $\Delta C$ between the fixed electrode 32 and the movable electrode 34 decreases by the same slope as that of the second process described above.

Furthermore, in the process (fourth process) from when the movable electrode 34 is driven/displaced from the position of x=A0 to the position of x=0, and in the process (fifth process) from when the movable electrode 34 is driven/displaced from the position of x=0 to the position of x=−A0, in the fixed electrode 32 facing the movable electrode 34, the middle part 102-3 among the electrode fingers 102 contributes to the decrease in the facing area of the fixed electrode 32 and the movable electrode 34. In this case, the gap dm in the Y-axis direction between the electrode finger 102 of the fixed electrode 32 and the electrode finger 52 of the movable electrode 34 is a relatively large constant value. Therefore, in the fourth and fifth processes described above, the capacitance change amount $\Delta C$ between the fixed electrode 32 and the movable electrode 34 decreases by a smaller slope compared to the slope in the third process described above.

Furthermore, in the process (sixth process) from when the movable electrode 34 is driven/displaced from a position (x=−A0) where the drive displacement amount x is the target displacement amount −A0 further to the x<−A0 side, in the fixed electrode 32 facing the movable electrode 34, the leading end part 102-2 among the electrode fingers 102 contributes to the decrease in the facing area of the fixed electrode 32 and the movable electrode 34. In this case, the gap dm in the Y-axis direction between the electrode finger 102 of the fixed electrode 32 and the electrode finger 52 of the movable electrode 34 is a relatively small constant value. Therefore, in the sixth process described above, the capacitance change amount $\Delta C$ between the fixed electrode 32 and the movable electrode 34 decreases by a greater slope compared to the slope of the fourth and fifth processes described above.

Furthermore, in the process (seventh process) from when the movable electrode 34 is driven/displaced from the position of x<−A0 to the position of x=−A0, in the fixed electrode 32 facing the movable electrode 34, the leading end part 102-2 among the electrode fingers 102 contributes to the increase in the facing area of the fixed electrode 32 and the movable electrode 34. In this case, the gap dm in the Y-axis direction between the electrode finger 102 of the fixed electrode 32 and the electrode finger 52 of the movable electrode 34 is a relatively small constant value. Therefore, in the seventh processes described above, the capacitance change amount ΔC between the fixed electrode 32 and the movable electrode 34 increases by the same slope as that of the sixth process described above.

Furthermore, in the process (eighth process) from when the movable electrode 34 is driven/displaced from the position of x=−A0 to the position of x=0, in the fixed electrode 32 facing the movable electrode 34, the middle part 102-3 among the electrode fingers 102 contributes to the increase in the facing area of the fixed electrode 32 and the movable electrode 34. In this case, the gap dm in the Y-axis direction between the electrode finger 102 of the fixed electrode 32 and the electrode finger 52 of the movable electrode 34 is a relatively large constant value. Therefore, in the eighth process described above, the capacitance change amount ΔC between the fixed electrode 32 and the movable electrode 34 increases by a smaller slope compared to the slope in the seventh process described above.

As described above, the structure of the displacement amount monitoring electrode 100 also has features that when the drive displacement amount x of the movable electrode 34 is between the target displacement amounts −A0 and A0, the change sensitivity of the capacitance change amount ΔC between the fixed electrode 32 and the movable electrode 34 with respect to the drive displacement amount x of the movable electrode 34 in the X-axis direction is relatively small, while when the drive displacement amount x of the movable electrode 34 satisfies x<−A0 or x>A0, the change sensitivity is relatively large.

That is to say, the structure of the displacement amount monitoring electrode 100 has features that the change sensitivity of the capacitance change amount ΔC described above becomes higher after the drive displacement of the movable electrode 34 reaches the target displacement amount A0 compared to that before the drive displacement of the movable electrode 34 reaches the target displacement amount A0, and the change sensitivity becomes higher after the drive displacement of the movable electrode 34 reaches the target displacement amount −A0 compared to that before the drive displacement of the movable electrode 34 reaches the target displacement amount −A0. Specifically, the fixed electrode 32 and the movable electrode 34 (particularly, the fixed electrode 32) are formed, such that the gap dm where the electrode fingers 102, 52 face each other (particularly, the gap where the leading end of the electrode finger 52 faces the electrode finger 102) becomes smaller after the drive displacement of the movable electrode 34 reaches the target displacement amount A0 compared to that before the drive displacement of the movable electrode 34 reaches the target displacement amount A0, and the change sensitivity becomes smaller after the drive displacement of the movable electrode 34 reaches the target displacement amount −A0 compared to that before the drive displacement of the movable electrode 34 reaches the target displacement amount −A0.

Therefore, also in the structure of the displacement amount monitoring electrode 100, the change sensitivity of the capacitance change amount ΔC between the fixed electrode 32 and the movable electrode 34 with respect to the drive displacement amount x of the movable electrode 34 after the movable electrode 34 is driven/displaced to the target displacement amount A0, −A0, is higher compared to that when the movable electrode 34 is positioned between the target displacement amounts −A0 and A0. Therefore, also in the structure of the displacement amount monitoring electrode 100 according to the present embodiment, the same effects as those of the structure of the displacement amount monitoring electrode 10 according to the first embodiment can be achieved.

Furthermore, in the structure of the displacement amount monitoring electrode 100, the gap where the respective parts of the electrode fingers 102 of the fixed electrode 32 and the electrode fingers 52 of the movable electrode 34 are adjacent to each other in the Y-axis direction, and the gap where the respective parts of the electrode fingers 102 of the fixed electrode 32 are adjacent to each other in the Y-axis direction can be at equal intervals, and therefore the configuration can be simplified and made compact compared to a structure having unequal gaps.

Incidentally, in the second embodiment described above, the gap dm where the electrode fingers 102, 52 of the fixed electrode 32 and the movable electrode 34 face each other (particularly, the gap where the leading end of the electrode finger 52 faces the electrode finger 102) is made smaller after the drive displacement of the movable electrode 34 reaches the target displacement amount A0 compared to that before the drive displacement of the movable electrode 34 reaches the target displacement amount A0. In this respect, the electrode finger 52 of the movable electrode 34 has the same cross-sectional area from the connection part with the base part 50 to the leading end, and the electrode finger 102 of the fixed electrode 32 has a cross-sectional area that changes from the connection part with the base part 40 to the leading end. However, the present invention is not so limited. The electrode fingers of the fixed electrode 32 and the electrode fingers of the movable electrode 34 may respectively have a cross-sectional area that changes from the connection part with the base part to the leading end.

Figure 12:
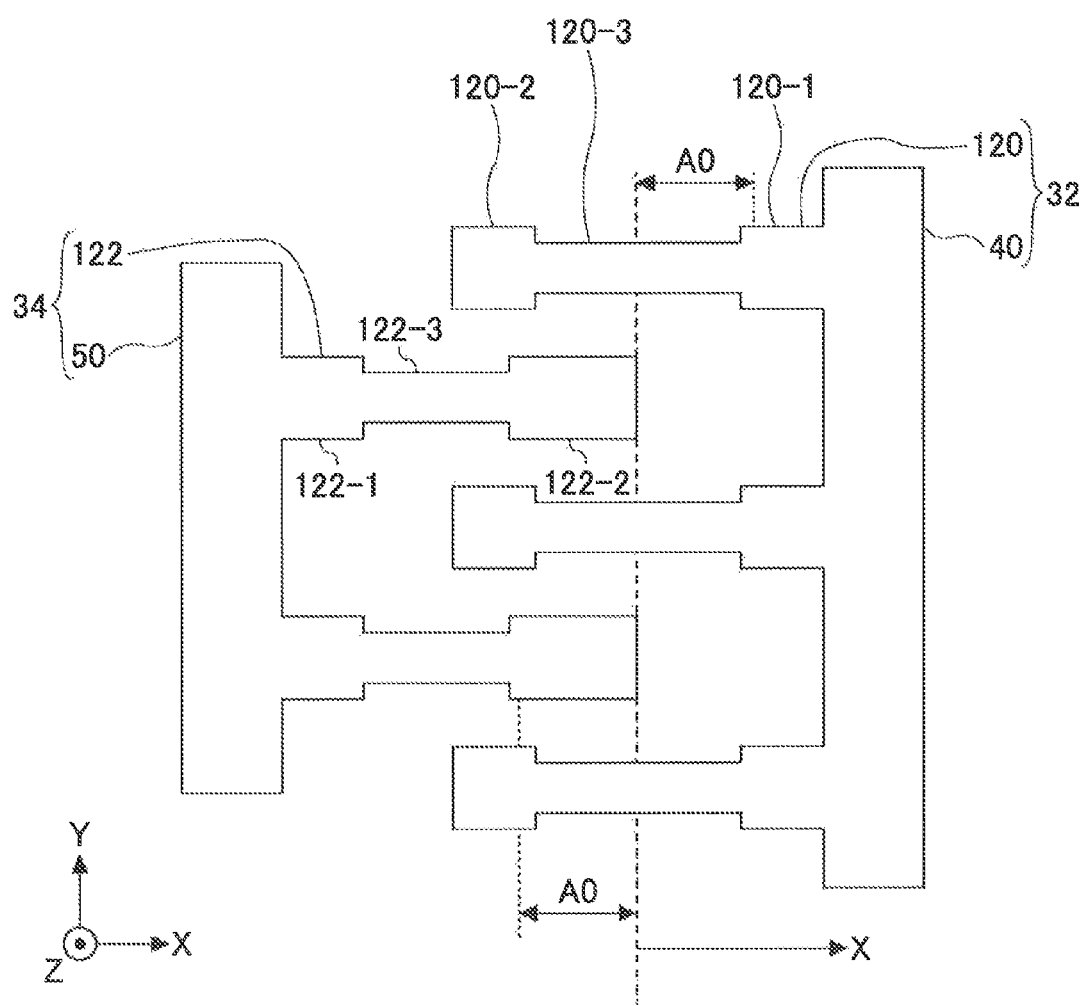
FIG. 12 is a top view of a displacement amount monitoring electrode according to a modification example of the second embodiment of the present invention.

For example, as illustrated in FIG. 12, each electrode finger 120 of the fixed electrode 32 may be constituted by a root part 120-1 near the connection part with the base part 40 where the cross-sectional area is relatively large, a leading end part 120-2 near the leading end where the cross-sectional area is relatively large, and a middle part 120-3 where the cross-sectional area is relatively small; and each electrode finger 122 of the movable electrode 34 may be constituted by a root part 122-1 near the connection part with the base part 50 where the cross-sectional area is relatively large, a leading end part 122-2 near the leading end where the cross-sectional area is relatively large, and a middle part 122-3 where the cross-sectional area is relatively small. In the structure of this modification example, the change sensitivity of the capacitance change amount ΔC between the fixed electrode 32 and the movable electrode 34 becomes even higher after the drive displacement of the movable electrode 34 reaches the target displacement amount A0, −A0 compared to that before the drive displacement of the movable electrode 34 reaches the target displacement amount A0, −A0, and therefore the effects can be made even more significant compared to that of the second embodiment described above.

Figure 13:
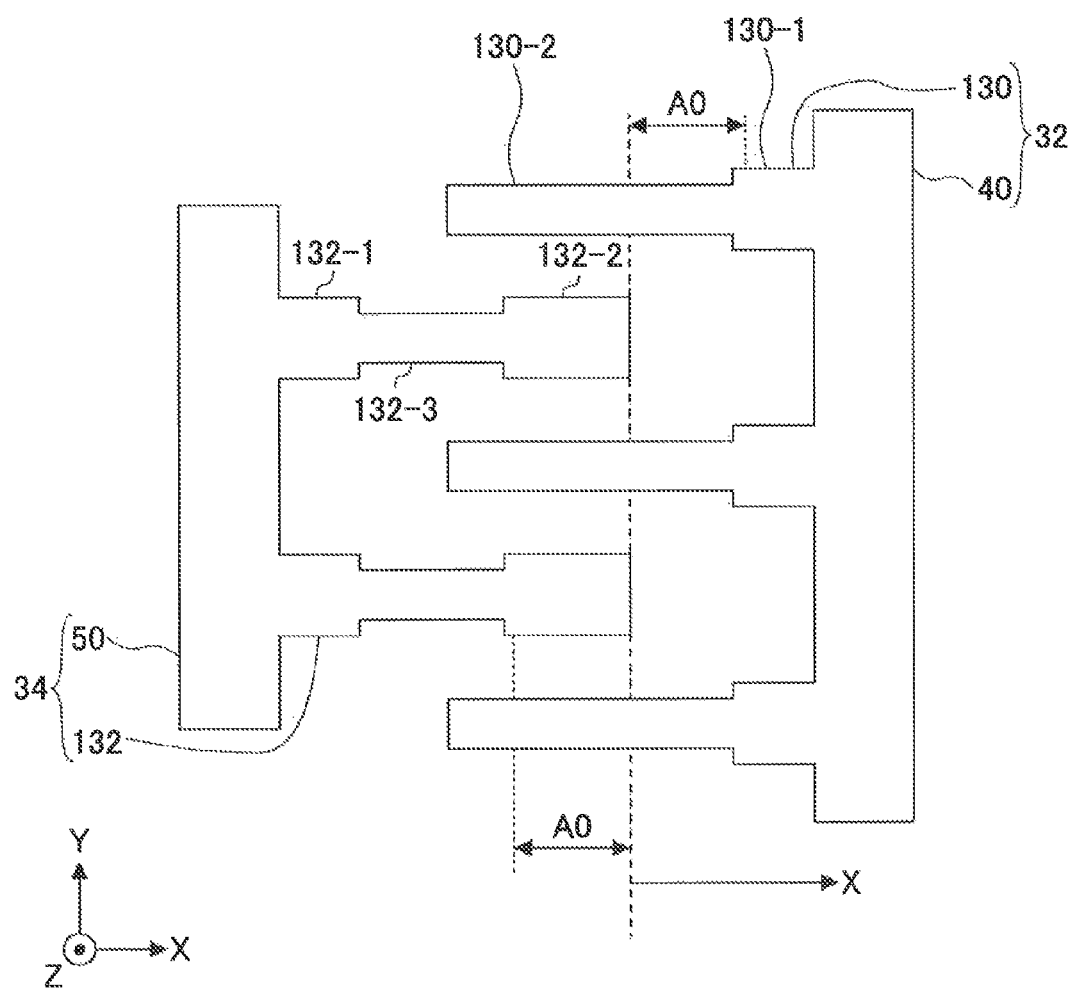
FIG. 13 is a top view of a displacement amount monitoring electrode according to a modification example of the second embodiment of the present invention.

Furthermore, as illustrated in FIG. 13, each electrode finger 130 of the fixed electrode 32 may be constituted by a root part 130-1 near the connection part with the base part 40 where the cross-sectional area is relatively large, and a foundation part 130-2 where the cross-sectional area is relatively small; and each electrode finger 132 of the movable electrode 34 may be constituted by a root part 132-1 near the connection part with the base part 50 where the cross-sectional area is relatively large, a leading end part 132-2 near the leading end where the cross-sectional area is relatively large, and a middle part 132-3 where the cross-sectional area is relatively small. In the structure of this modification example, the change sensitivity of the capacitance change amount ΔC between the fixed electrode 32 and the movable electrode 34 becomes even higher after the drive displacement of the movable electrode 34 reaches the target displacement amount A0 compared to that before the drive displacement of the movable electrode 34 reaches the target displacement amount A0, and therefore the effects can be made even more significant compared to that of the second embodiment described above.

Figure 14:
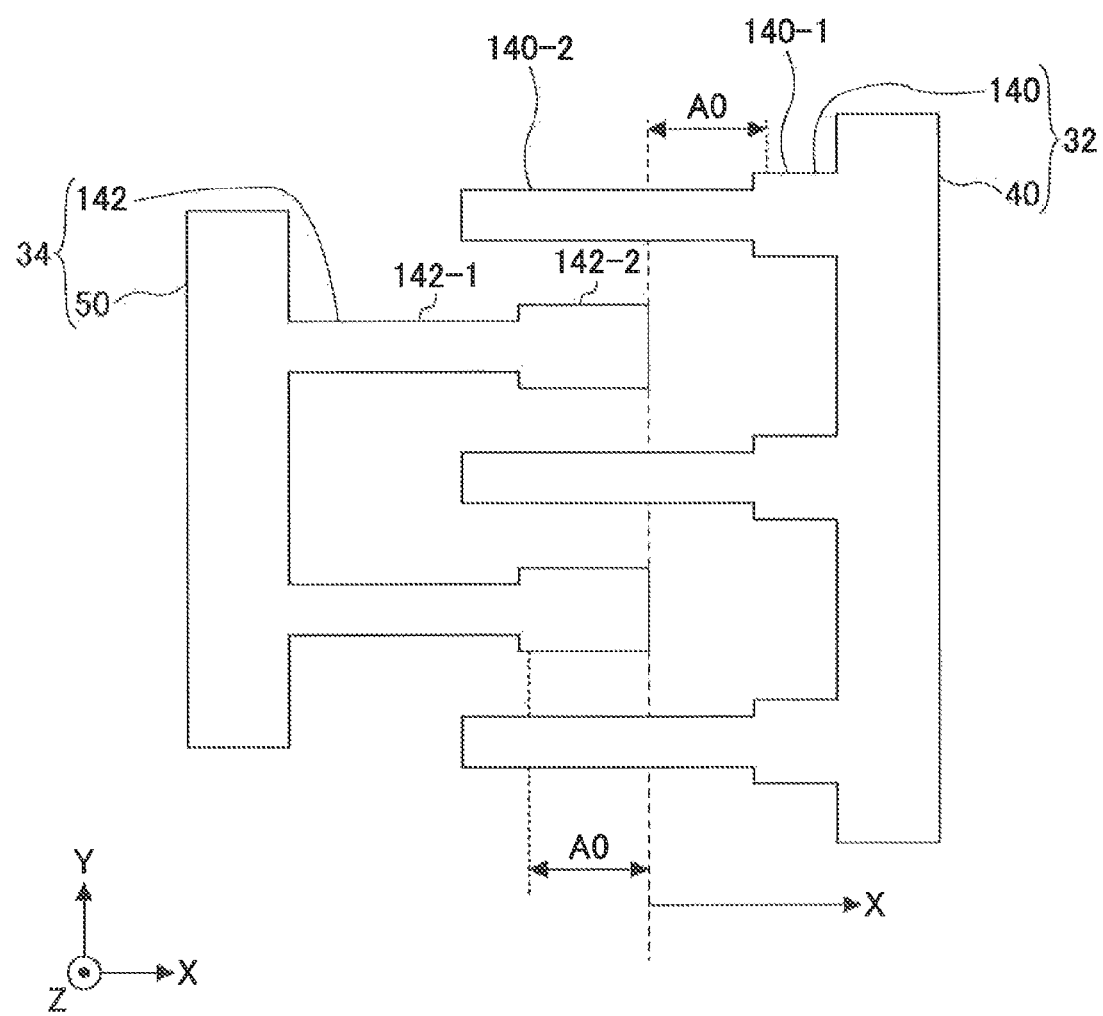
FIG. 14 is a top view of a displacement amount monitoring electrode according to a modification example of the second embodiment of the present invention.

Furthermore, as illustrated in FIG. 14, each electrode finger 140 of the fixed electrode 32 may be constituted by a root part 140-1 near the connection part with the base part 40 where the cross-sectional area is relatively large, and a foundation part 140-2 where the cross-sectional area is relatively small; and each electrode finger 142 of the movable electrode 34 may be constituted by a foundation part 142-1 where the cross-sectional area is relatively small and a leading end part 142-2 near the connection part with the base part 50 where the cross-sectional area is relatively large. In the structure of this modification example, the change sensitivity of the capacitance change amount ΔC between the fixed electrode 32 and the movable electrode 34 becomes even higher after the drive displacement of the movable electrode 34 reaches the target displacement amount A0 compared to that before the drive displacement of the movable electrode 34 reaches the target displacement amount A0, and therefore the effects can be made even more significant compared to that of the second embodiment described above.

Figure 15:
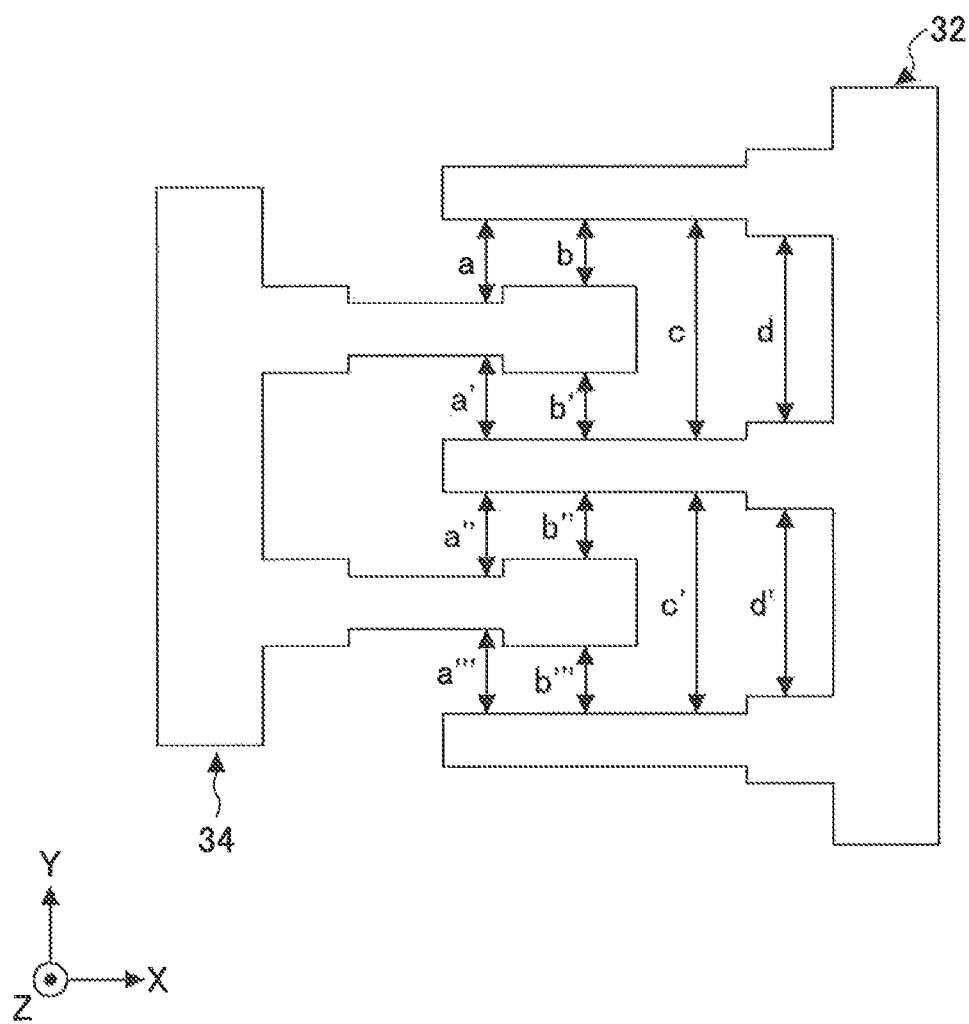
FIG. 15 is for describing the effects of the displacement amount monitoring electrode according to the second embodiment of the present invention and the modification examples thereof.

Furthermore, in the structures of the modification examples illustrated in FIGS. 12 through 14 described above, as illustrated in FIG. 15 (note that FIG. 15 illustrates the structure of the modification example illustrated in FIG. 13), as the entire configuration of the displacement amount monitoring electrode 100, the gaps at the respective parts where the electrode fingers of the fixed electrode 32 and the electrode fingers of the movable electrode 34 face each other in the Y-axis direction, and the gaps at the respective parts where the electrode fingers of the fixed electrode 32 are adjacent to each other in the Y-axis direction, can be can be at equal intervals (that is to say, as illustrated in FIG. 15, a=a'=a''=a''', b=b'=b''=b''', c=c', and d=d' can be satisfied), and therefore the configuration can be simplified and made compact compared to a structure having unequal gaps.

Third Embodiment

Figure 16:
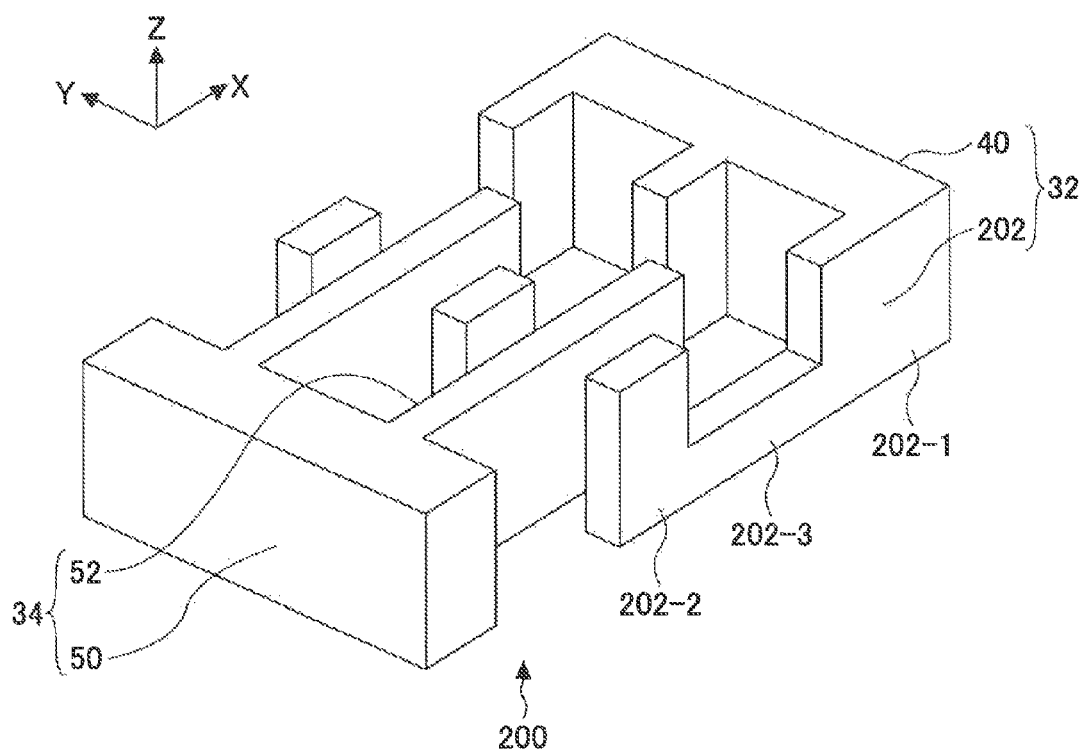
FIG. 16 is a perspective view of a displacement amount monitoring electrode according to a third embodiment of the present invention.
Figure 17:
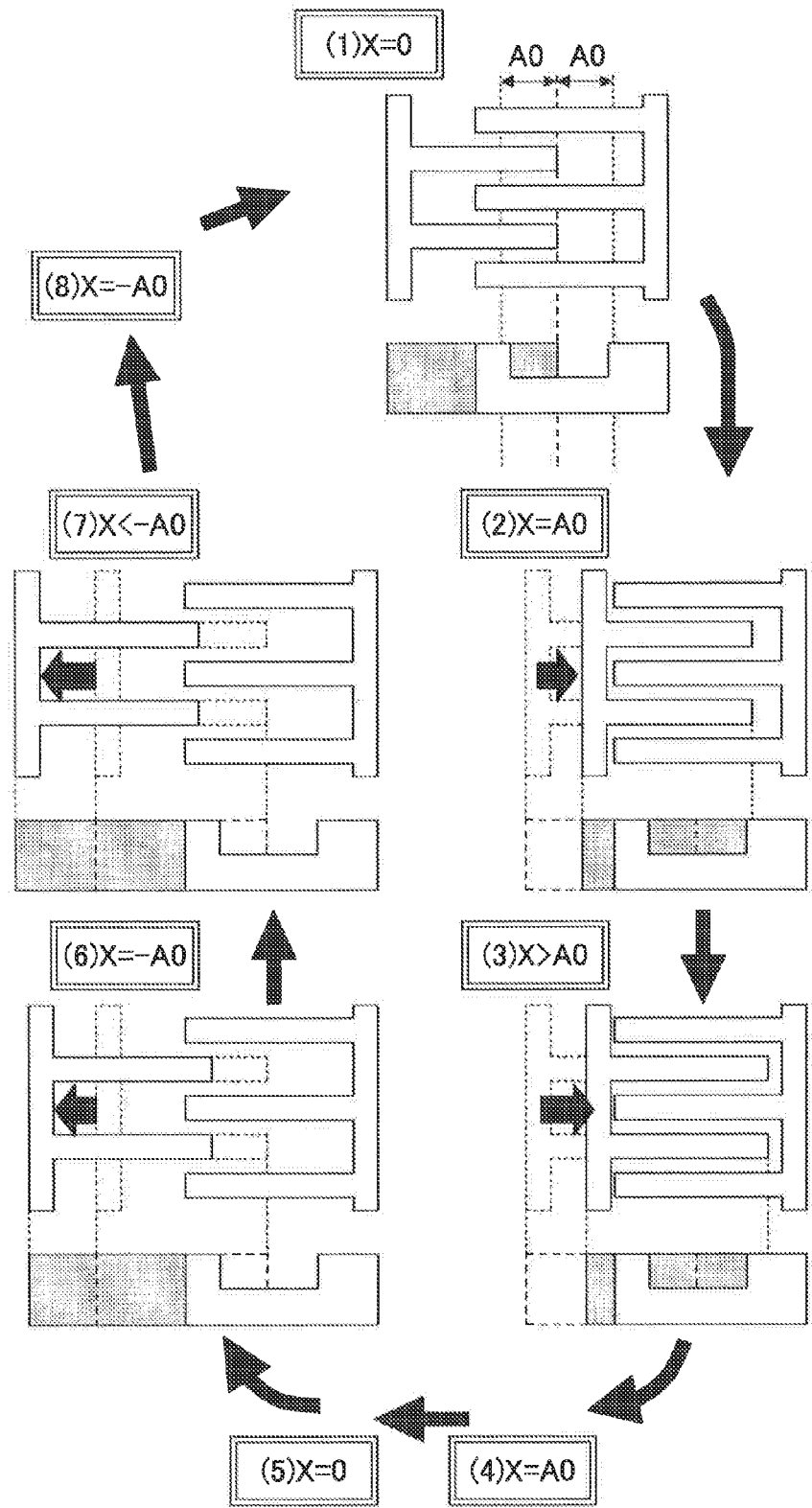
FIG. 17 illustrates operation procedures in the displacement amount monitoring electrode according to the third embodiment of the present invention.

FIG. 16 is a top view of a displacement amount monitoring electrode 200 according to a third embodiment of the present invention. Note that in FIG. 16, the same elements as those of the configuration illustrated in FIG. 2 described above are denoted by the same reference numerals and descriptions thereof are omitted or simplified. Furthermore, FIG. 17 illustrates operation procedures in the displacement amount monitoring electrode 200 according to the present embodiment.

The displacement amount monitoring electrode 200 according to the present embodiment includes the fixed electrode 32 and the movable electrode 34. The fixed electrode 32 is formed to have a comb-teeth shape, and includes electrode fingers 202 extending from the base part 40 in an X-axis direction parallel to the semiconductor substrate 14. There are a plurality of electrode fingers 202 arranged at equal intervals in a Y-axis direction parallel with each other, with respect to a single base part 40. The electrode fingers 202 have the same shape. Each of the electrode fingers 202 has a square cross-sectional shape, and is constituted so that the cross-sectional area changes from the connection part with the base part 40 to the leading end.

Specifically, in each of the electrode fingers 202, the thickness in the Z-axis direction near the connection part with the base part 40 and at the part near the leading end is greater than the thickness in the Z-axis direction at a part in the middle of the these parts. Accordingly, the cross-sectional area at the part near the connection part with the base part 40 and the part near the leading end is greater than the cross-sectional area at a part in the middle of the these parts. In the following, in the electrode finger 202, the part near the connection part with the base part 40 where the cross-sectional area is relatively large is referred to as a root part 202-1, the part near the leading end where the cross-sectional area is relatively large is referred to as a leading end part 202-2, and the part in the middle where the cross-sectional area is relatively small is referred to as a middle part 202-3.

The fixed electrode 32 and the movable electrode 34 are disposed such that the base parts 40, 50 face each other in the X-axis direction and the electrode fingers 202 and the electrode fingers 52 face each other and are meshed together in the Y-axis direction. Specifically, the electrode fingers 52 of the movable electrode 34 are disposed so as to enter the center position between two electrode fingers 202 adjacent to each other in the Y-axis direction of the fixed electrode 32. Between the electrode fingers 52 of the movable electrode 34 and the electrode fingers 202 of the fixed electrode 32 adjacent to each other in the Y-axis direction, a predetermined gap d0 is formed in the Y-axis direction.

The electrode fingers 52 of the movable electrode 34 are constituted such that the leading ends are positioned, in the X-axis direction, at the center of the middle part 202-3 of the electrode finger 202 of the fixed electrode 32, at the oscillation center (i.e., displacement center of the movable electrode 34) of the structure bodies 16, 18. Furthermore, the distance in the X-axis direction of the middle part 202-3, that is to say, the distance in the X-axis direction between the root part 202-1 and the leading end part 202-2, is set to be the same as a value that is two times a target amplitude (i.e., a target displacement amount from the oscillation center of the leading end of the movable electrode 34 corresponding to the target amplitude) A0 of the structure bodies 16, 18, or slightly smaller than this value.

Furthermore, a thickness (i.e., the height at a part where the side wall of the electrode fingers 202 and the side wall of the electrode fingers 52 face each other in the Z-axis direction) Tm at a part where the electrode fingers 202 of the fixed electrode 32 and the electrode fingers 52 of the movable electrode 34 adjacent to each other in the Y-axis direction overlap in the thickness direction, i.e., the Z-axis direction, is set to be different according to the parts; specifically, the thickness between the electrode finger 52 and the root part 202-1 and the thickness between the electrode finger 52 and the leading end part 202-2 are relatively large, and the thickness between the electrode finger 52 and the middle part 202-3 is relatively small.

In the displacement amount monitoring electrode 200 having the above structure, in the process (first process) from when the movable electrode 34 is driven/displaced from a position (x=0) where the drive displacement amount x is zero to a position (x=A0) where the drive displacement amount x is the target displacement amount A0, in the fixed electrode 32 facing the movable electrode 34, the middle part 202-3 among the electrode fingers 202 contributes to the increase in the facing area of the fixed electrode 32 and the movable electrode 34. In this case, the height Tm in the Z-axis direction where the electrode finger 202 of the fixed electrode 32 and the electrode finger 52 of the movable electrode 34 face each other in the Y-axis direction is a relatively small constant value, and the area where the fixed electrode 32 and the movable electrode 34 face each other with a gap d0 therebetween, increases proportionally according to the displacement of the movable electrode 34. Therefore, in the above first process, the capacitance change amount ΔC between the fixed electrode 32 and the movable electrode 34 increases at a constant slope.

Furthermore, in the process (second process) from when the movable electrode 34 is driven/displaced from a position (x=A0) where the drive displacement amount x is the target displacement amount A0 further to the x>A0 side, in the fixed electrode 32 facing the movable electrode 34, the root part 202-1 among the electrode fingers 202 contributes to the increase in the facing area of the fixed electrode 32 and the movable electrode 34. In this case, the height Tm in the Z-axis direction where the electrode finger 202 of the fixed electrode 32 and the electrode finger 52 of the movable electrode 34 face each other in the Y-axis direction is a relatively large constant value, and the area where the fixed electrode 32 and the movable electrode 34 face each other with a gap d0 therebetween, increases proportionally according to the displacement of the movable electrode 34, and also the increase in slope of the area is greater than the increase in slope in the first process described above. Therefore, in the second process described above, the capacitance change amount ΔC between the fixed electrode 32 and the movable electrode 34 increases by a greater slope compared to the slope of the first process described above.

Furthermore, in the process (third process) from when the movable electrode 34 is driven/displaced from the position of x>A0 to the position of x=A0, in the fixed electrode 32 facing the movable electrode 34, the root part 202-1 among the electrode fingers 202 contributes to the decrease in the facing area of the fixed electrode 32 and the movable electrode 34. In this case, the height Tm in the Z-axis direction where the electrode finger 202 of the fixed electrode 32 and the electrode finger 52 of the movable electrode 34 face each other in the Y-axis direction is a relatively large constant value, and the area where the fixed electrode 32 and the movable electrode 34 face each other with a gap d0 therebetween, decreases proportionally according to the displacement of the movable electrode 34. Therefore, in the third process described above, the capacitance change amount ΔC between the fixed electrode 32 and the movable electrode 34 decreases by the same slope as that of the second process described above.

Furthermore, in the process (fourth process) from when the movable electrode 34 is driven/displaced from the position of x=A0 to the position of x=0, and in the process (fifth process) from when the movable electrode 34 is driven/displaced from the position of x=0 to the position of x=−A0, in the fixed electrode 32 facing the movable electrode 34, the middle part 202-3 among the electrode fingers 202 contributes to the decrease in the facing area of the fixed electrode 32 and the movable electrode 34. In this case, the height Tm in the Z-axis direction where the electrode finger 202 of the fixed electrode 32 and the electrode finger 52 of the movable electrode 34 face each other in the Y-axis direction is a relatively small constant value, and the area where the fixed electrode 32 and the movable electrode 34 face each other with a gap d0 therebetween, decreases proportionally according to the displacement of the movable electrode 34, and also the decrease in slope of the area is smaller than the decrease in slope in the third process described above. Therefore, in the fourth and fifth processes described above, the capacitance change amount ΔC between the fixed electrode 32 and the movable electrode 34 decreases by a smaller slope compared to the slope in the third process described above.

Furthermore, in the process (sixth process) from when the movable electrode 34 is driven/displaced from a position (x=−A0) where the drive displacement amount x is the target displacement amount −A0 further to the x<−A0 side, in the fixed electrode 32 facing the movable electrode 34, the leading end part 202-2 among the electrode fingers 202 contributes to the decrease in the facing area of the fixed electrode 32 and the movable electrode 34. In this case, the height Tm in the Z-axis direction where the electrode finger 202 of the fixed electrode 32 and the electrode finger 52 of the movable electrode 34 face each other in the Y-axis direction is a relatively large constant value, and the area where the fixed electrode 32 and the movable electrode 34 face each other with a gap d0 therebetween, decreases proportionally according to the displacement of the movable electrode 34, and also the decrease in slope of the area is greater than the decrease in slope in the fourth and fifth processes described above. Therefore, in the sixth process described above, the capacitance change amount ΔC between the fixed electrode 32 and the movable electrode 34 decreases by a greater slope compared to the slope of the fourth and fifth processes described above.

Furthermore, in the process (seventh process) from when the movable electrode 34 is driven/displaced from the position of x<−A0 to the position of x=−A0, in the fixed electrode 32 facing the movable electrode 34, the leading end part 202-2 among the electrode fingers 202 contributes to the increase in the facing area of the fixed electrode 32 and the movable electrode 34. In this case, the height Tm in the Z-axis direction where the electrode finger 202 of the fixed electrode 32 and the electrode finger 52 of the movable electrode 34 face each other in the Y-axis direction is a relatively large constant value, and the area where the fixed electrode 32 and the movable electrode 34 face each other with a gap d0 therebetween, increases proportionally according to the displacement of the movable electrode 34. Therefore, in the seventh processes described above, the capacitance change amount ΔC between the fixed electrode 32 and the movable electrode 34 increases by the same slope as that of the sixth process described above.

Furthermore, in the process (eighth process) from when the movable electrode 34 is driven/displaced from the position of x=−A0 to the position of x=0, in the fixed electrode 32 facing the movable electrode 34, the middle part 202-3 among the electrode fingers 202 contributes to the increase in the facing area of the fixed electrode 32 and the movable electrode 34. In this case, the height Tm in the Z-axis direction where the electrode finger 202 of the fixed electrode 32 and the electrode finger 52 of the movable electrode 34 face each other in the Y-axis direction is a relatively small constant value, and the area where the fixed electrode 32 and the movable electrode 34 face each other with a gap d0 therebetween, increases proportionally according to the displacement of the movable electrode 34, and also the increase in slope of the area is smaller than the increase in slope in the seventh process described above. Therefore, in the eighth process described above, the capacitance change amount ΔC between the fixed electrode 32 and the movable electrode 34 increases by a smaller slope compared to the slope in the seventh process described above.

As described above, the structure of the displacement amount monitoring electrode 200 also has features that when the drive displacement amount x of the movable electrode 34 is between the target displacement amounts −A0 and A0, the change sensitivity of the capacitance change amount ΔC between the fixed electrode 32 and the movable electrode 34 with respect to the drive displacement amount x of the movable electrode 34 in the X-axis direction is relatively small, while when the drive displacement amount x of the movable electrode 34 satisfies x<−A0 or x>A0, the change sensitivity is relatively large.

That is to say, the structure of the displacement amount monitoring electrode 200 has features that the change sensitivity of the capacitance change amount ΔC described above becomes higher after the drive displacement of the movable electrode 34 reaches the target displacement amount A0 compared to that before the drive displacement of the movable electrode 34 reaches the target displacement amount A0, and the change sensitivity becomes higher after the drive displacement of the movable electrode 34 reaches the target displacement amount −A0 compared to that before the drive displacement of the movable electrode 34 reaches the target displacement amount −A0. Specifically, the fixed electrode 32 and the movable electrode 34 (particularly, the fixed electrode 32) are formed, such that the height Tm in the Z-axis direction where the electrode fingers 202, 52 face each other in the Y-axis direction (particularly, the height in the Z-axis direction where the leading end of the electrode finger 52 faces the electrode finger 202) becomes higher after the drive displacement of the movable electrode 34 reaches the target displacement amount A0 compared to that before the drive displacement of the movable electrode 34 reaches the target displacement amount A0, and the change sensitivity becomes higher after the drive displacement of the movable electrode 34 reaches the target displacement amount −A0 compared to that before the drive displacement of the movable electrode 34 reaches the target displacement amount −A0.

Therefore, also in the structure of the displacement amount monitoring electrode 200, the change sensitivity of the capacitance change amount ΔC between the fixed electrode 32 and the movable electrode 34 with respect to the drive displacement amount x of the movable electrode 34 after the movable electrode 34 is driven/displaced to the target displacement amounts A0, −A0, is higher compared to that when the movable electrode 34 is positioned between the target displacement amounts −A0 and A0. Therefore, also in the structure of the displacement amount monitoring electrode 200 according to the present embodiment, the same effects as those of the structure of the displacement amount monitoring electrode 10, 100 according to the first embodiment and the second embodiment can be achieved.

Furthermore, in the structure of the displacement amount monitoring electrode 200, unlike the structure of the displacement amount monitoring electrode 10, 100 according to the first embodiment and the second embodiment, the electrode finger 202 of the fixed electrode 32 and the electrode finger 52 of the movable electrode 34 each has a width in the Y-axis direction that does not change from the leading end to the connection part with the base part 40, 50. Therefore, the gap where the electrode finger 202 of the fixed electrode 32 and the electrode finger 52 of the movable electrode 34 face each other in the Y-axis direction, the gap where the electrode fingers 202 of the fixed electrode 32 are adjacent to each other in the Y-axis direction, and the gap where the electrode fingers 52 of the movable electrode 34 are adjacent to each other in the Y-axis direction, can have a minimum length and can be at equal intervals, and therefore the configuration can be simplified and made compact compared to a structure having unequal gaps, and the area occupied by the displacement amount monitoring electrode 200 on the semiconductor substrate 14 can be prevented from increasing.

Incidentally, in the third embodiment described above, the height Tm in the Z-axis direction where the electrode fingers 202, 52 of the fixed electrode 32 and the movable electrode 34 face each other in the Y-axis direction (particularly, the height in the Z-axis direction where the leading end of the electrode finger 52 faces the electrode finger 202) is made smaller after the drive displacement of the movable electrode 34 reaches the target displacement amount A0 compared to that before the drive displacement of the movable electrode 34 reaches the target displacement amount A0. In this respect, the electrode fingers 52 of the movable electrode 34 is made to have the same cross-sectional area from the connection part with the base part 50 to the leading end, and the electrode finger 202 of the fixed electrode 32 has a cross-sectional area that changes from the connection part with the base part 40 to the leading end. However, the present invention is not so limited. The electrode fingers of the fixed electrode 32 and the electrode fingers of the movable electrode 34 may respectively have a cross-sectional area that changes from the connection part with the base part to the leading end.

Figure 18A:
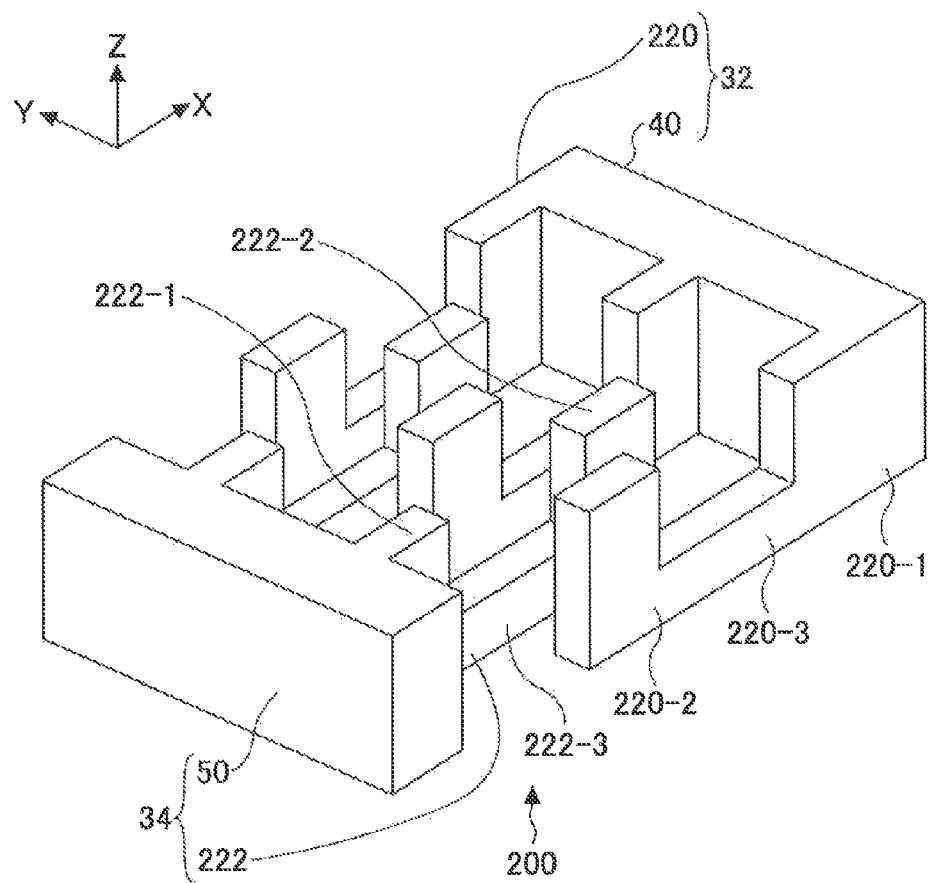
FIG. 18A is a perspective view of a displacement amount monitoring electrode according to a modification example of the third embodiment of the present invention.
Figure 18B:
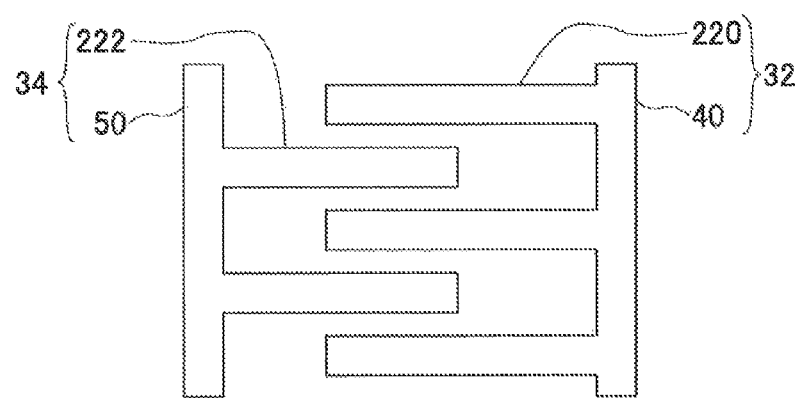
FIG. 18B is a top view of the displacement amount monitoring electrode illustrated in FIG. 18A.
Figure 18C:
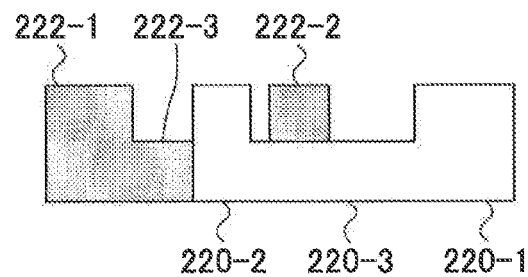
FIG. 18C is a side view of the displacement amount monitoring electrode illustrated in FIG. 18A.

For example, as illustrated in FIG. 18A, FIG. 18B, and FIG. 18C, each electrode finger 220 of the fixed electrode 32 may be constituted by a root part 220-1 near the connection part with the base part 40 where the cross-sectional area is relatively large, a leading end part 220-2 near the leading end where the cross-sectional area is relatively large, and a middle part 220-3 where the cross-sectional area is relatively small; and each electrode finger 222 of the movable electrode 34 may be constituted by a root part 222-1 near the connection part with the base part 50 where the cross-sectional area is relatively large, a leading end part 222-2 near the leading end where the cross-sectional area is relatively large, and a middle part 222-3 where the cross-sectional area is relatively small. In the structure of this modification example, the change sensitivity of the capacitance change amount ΔC between the fixed electrode 32 and the movable electrode 34 becomes even higher after the drive displacement of the movable electrode 34 reaches the target displacement amount A0, −A0 compared to that before the drive displacement of the movable electrode 34 reaches the target displacement amount A0, −A0, and therefore the effects can be made even more significant compared to that of the third embodiment described above.

Figure 19A:
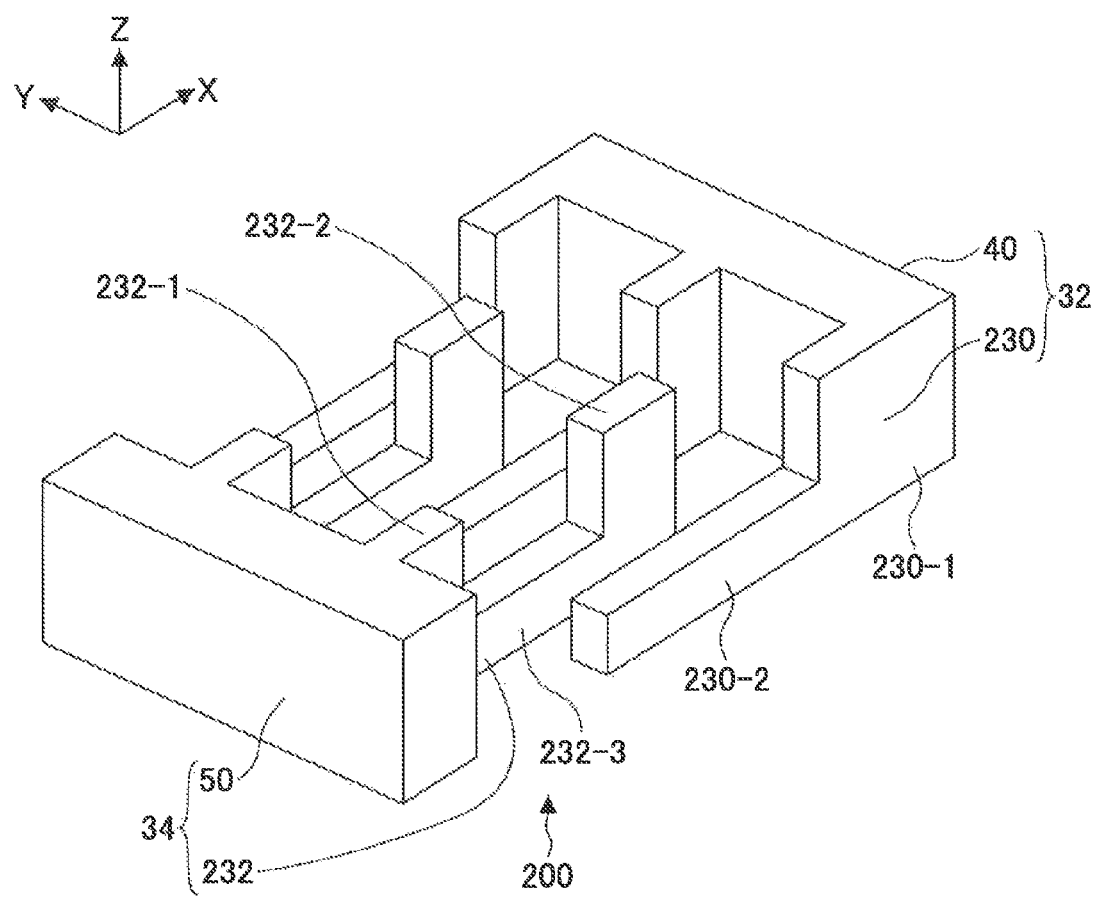
FIG. 19A is a perspective view of a displacement amount monitoring electrode according to a modification example of the third embodiment of the present invention.
Figure 19B:
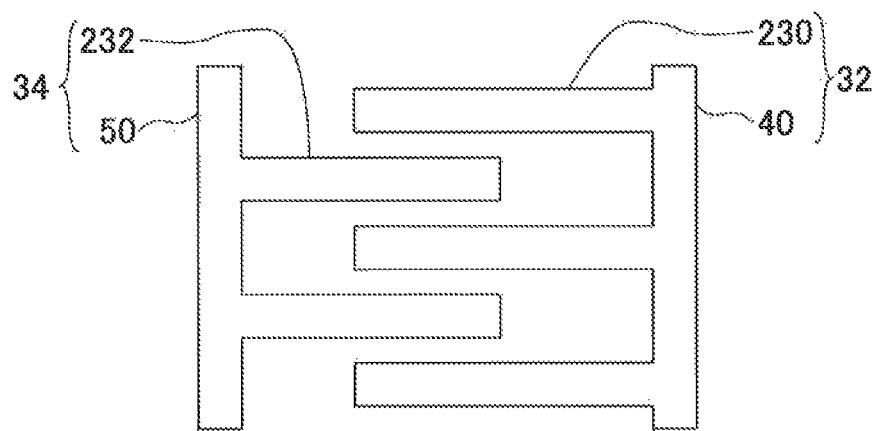
FIG. 19B is a top view of the displacement amount monitoring electrode illustrated in FIG. 19A.
Figure 19C:
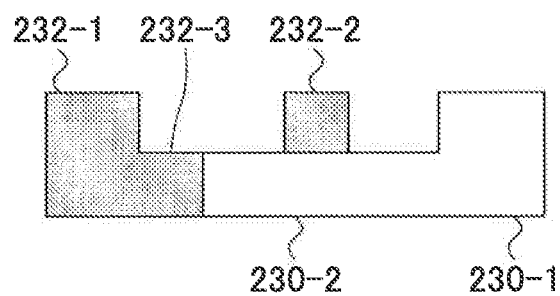
FIG. 19C is a side view of the displacement amount monitoring electrode illustrated in FIG. 19A.

Furthermore, as illustrated in FIG. 19A, FIG. 19B, and FIG. 19C, each electrode finger 230 of the fixed electrode 32 may be constituted by a root part 230-1 near the connection part with the base part 40 where the cross-sectional area is relatively large, and a foundation part 230-2 where the cross-sectional area is relatively small; and each electrode finger 232 of the movable electrode 34 may be constituted by a root part 232-1 near the connection part with the base part 50 where the cross-sectional area is relatively large, a leading end part 232-2 near the leading end where the cross-sectional area is relatively large, and a middle part 232-3 where the cross-sectional area is relatively small. In the structure of this modification example, the change sensitivity of the capacitance change amount ΔC between the fixed electrode 32 and the movable electrode 34 becomes even higher after the drive displacement of the movable electrode 34 reaches the target displacement amount A0 compared to that before the drive displacement of the movable electrode 34 reaches the target displacement amount A0, and therefore the effects can be made even more significant compared to that of the third embodiment described above.

Figure 20A:
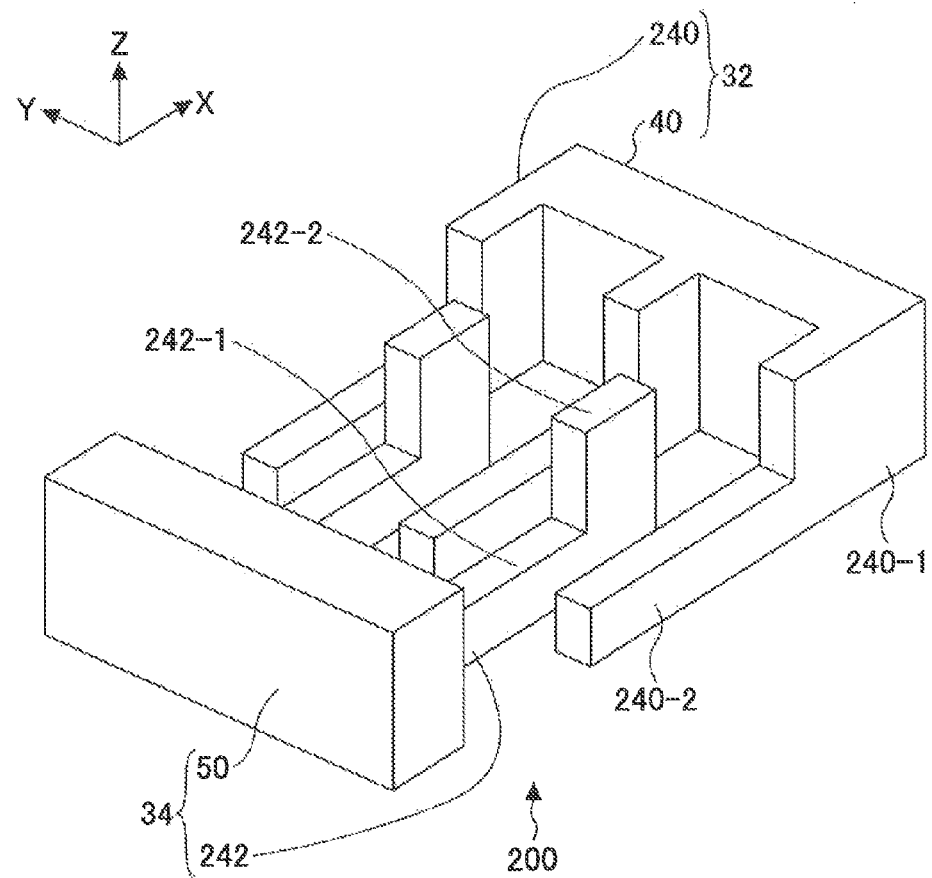
FIG. 20A is a perspective view of a displacement amount monitoring electrode according to a modification example of the third embodiment of the present invention.
Figure 20B:
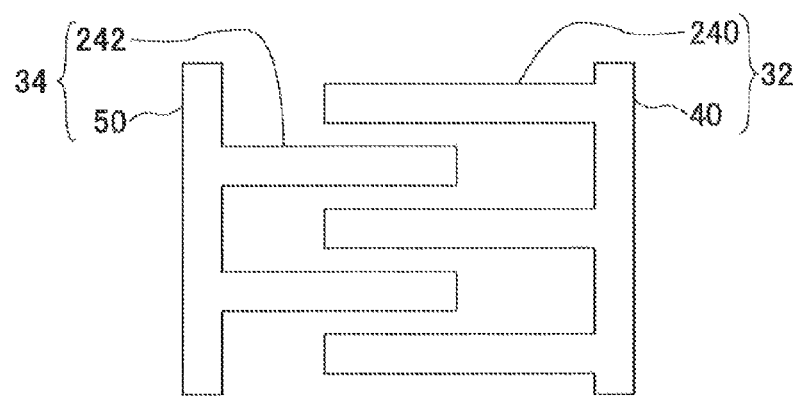
FIG. 20B is a top view of the displacement amount monitoring electrode illustrated in FIG. 20A.
Figure 20C:
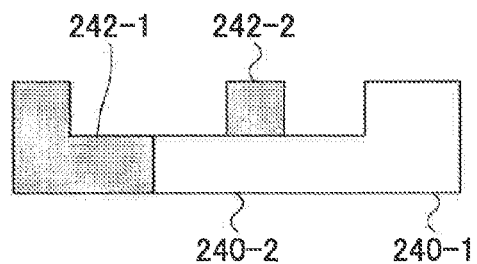
FIG. 20C is a side view of the displacement amount monitoring electrode illustrated in FIG. 20A.

Furthermore, as illustrated in FIG. 20A, FIG. 20B, and FIG. 20C, each electrode finger 240 of the fixed electrode 32 may be constituted by a root part 240-1 near the connection part with the base part 40 where the cross-sectional area is relatively large, and a foundation part 240-2 where the cross-sectional area is relatively small; and each electrode finger 242 of the movable electrode 34 may be constituted by a foundation part 242-1 where the cross-sectional area is relatively small and a leading end part 242-2 near the connection part with the base part 50 where the cross-sectional area is relatively large. In the structure of this modification example, the change sensitivity of the capacitance change amount ΔC between the fixed electrode 32 and the movable electrode 34 becomes even higher after the drive displacement of the movable electrode 34 reaches the target displacement amount A0 compared to that before the drive displacement of the movable electrode 34 reaches the target displacement amount A0, and therefore the effects can be made even more significant compared to that of the third embodiment described above.

Figure 21:
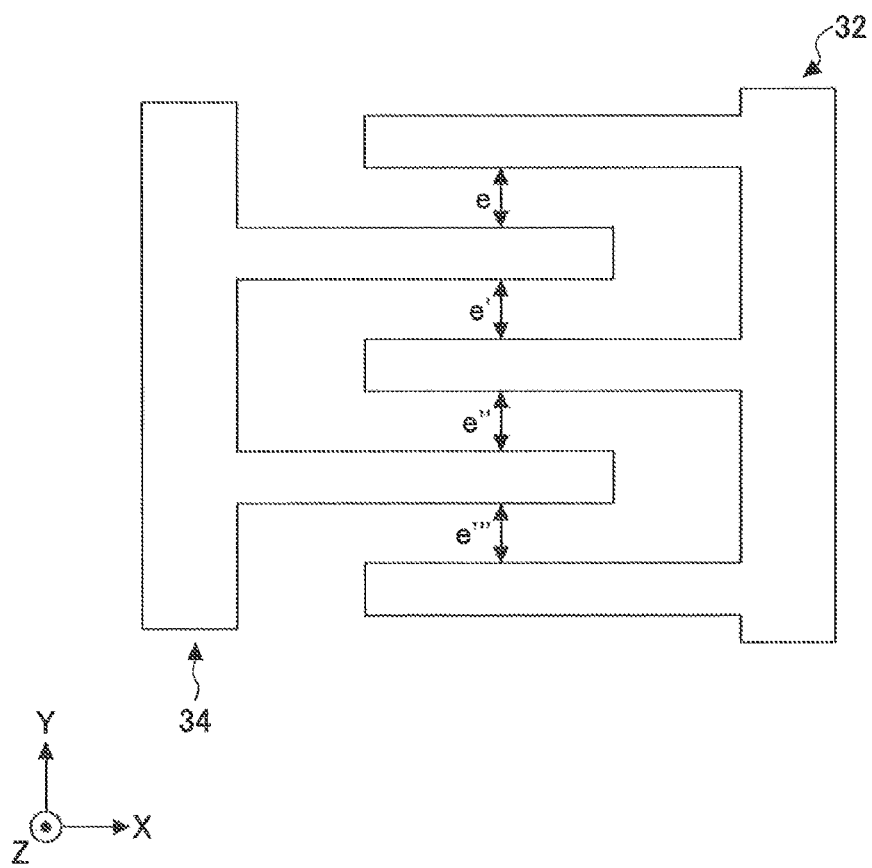
FIG. 21 is for describing the effects of the displacement amount monitoring electrode according to the third embodiment of the present invention and the modification examples thereof.

Furthermore, in the structures of the modification examples illustrated in FIGS. 18 through 20 described above, as the entire configuration of the displacement amount monitoring electrode 200, the gap where the electrode finger of the fixed electrode 32 and the electrode finger of the movable electrode 34 face each other in the Y-axis direction, the gap where the electrode fingers of the fixed electrode 32 are adjacent to each other in the Y-axis direction, and the gap where the electrode fingers of the movable electrode 34 are adjacent to each other in the Y-axis direction, can have a minimum length and can be at equal intervals (for example, as illustrated in FIG. 21, e=e'=e''=e''' can be satisfied), and therefore the configuration can be simplified and made compact compared to a structure having unequal gaps, and the area occupied by the displacement amount monitoring electrode 200 on the semiconductor substrate 14 can be prevented from increasing.

Fourth Embodiment

Figure 22A:
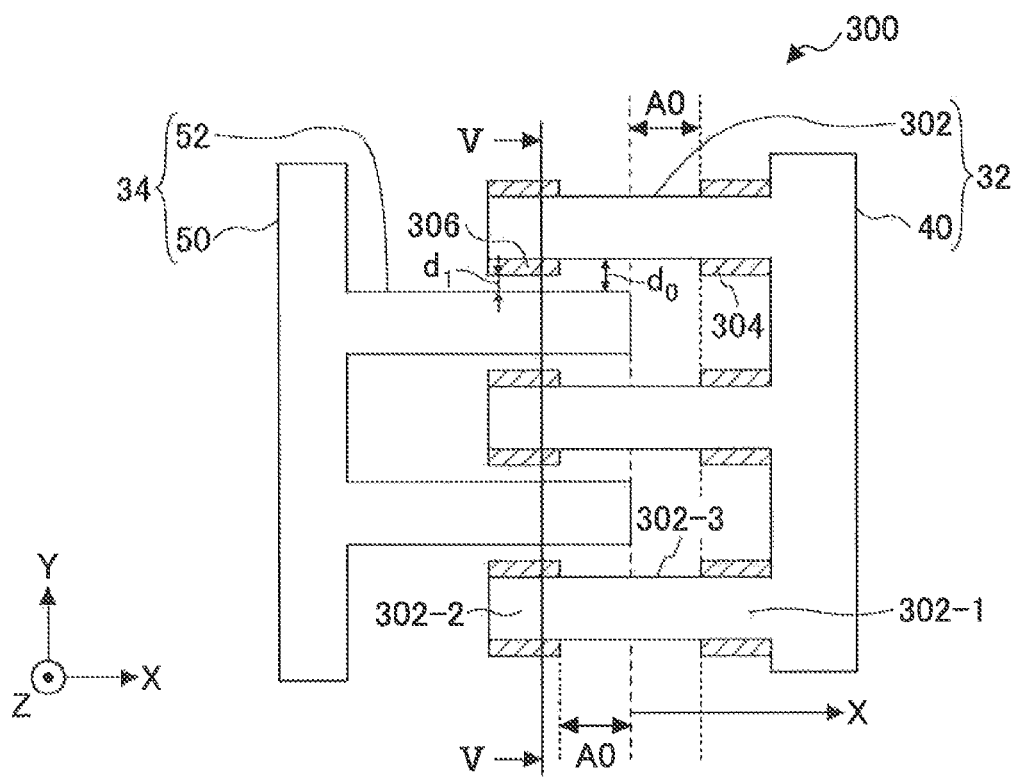
FIG. 22A is a top view of a displacement amount monitoring electrode according to a fourth embodiment of the present invention.
Figure 22B:
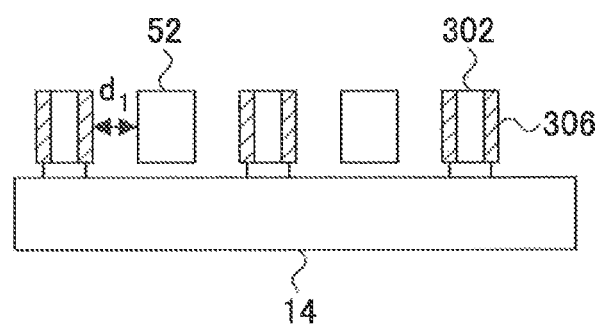
FIG. 22B is a cross-sectional view cut along V-V of the displacement amount monitoring electrode illustrated in FIG. 22A.
Figure 23:
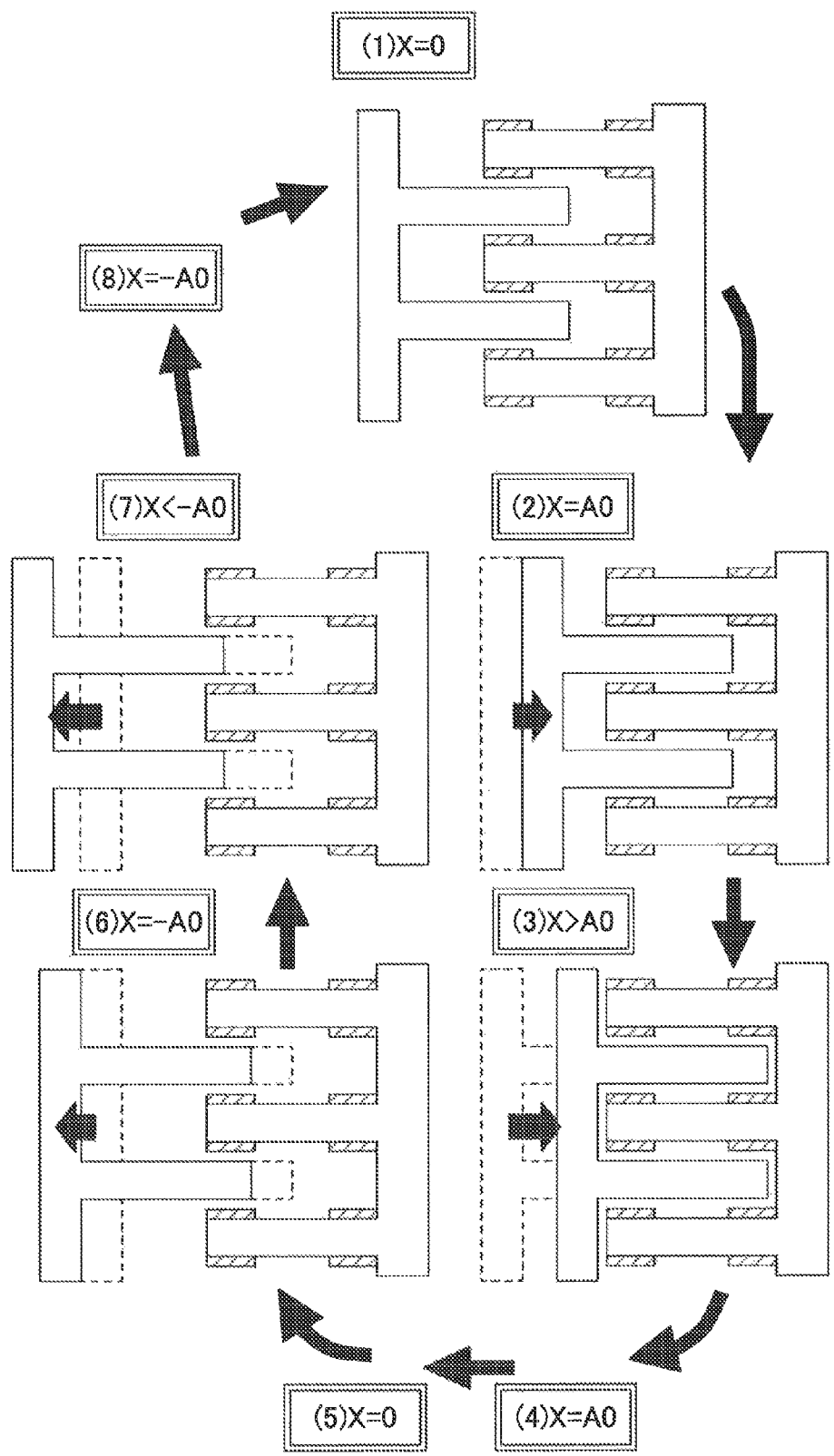
FIG. 23 illustrates the operation procedures of the displacement amount monitoring electrode according to the fourth embodiment of the present invention.

FIG. 22A is a top view of a displacement amount monitoring electrode 300 according to a fourth embodiment of the present invention. FIG. 22B is a cross-sectional view cut along V-V of the displacement amount monitoring electrode 300 illustrated in FIG. 22A. Note that in FIG. 22A and FIG. 22B, the same elements as those of the configuration illustrated in FIG. 2 described above are denoted by the same reference numerals and descriptions thereof are omitted or simplified. Furthermore, FIG. 23 illustrates operation procedures in the displacement amount monitoring electrode 300 according to the present embodiment.

The displacement amount monitoring electrode 300 according to the present embodiment includes the fixed electrode 32 and the movable electrode 34. The fixed electrode 32 is formed to have a comb-teeth shape, and includes electrode fingers 302 extending from the base part 40 in an X-axis direction parallel to the semiconductor substrate 14. There are a plurality of electrode fingers 302 arranged at equal intervals in a Y-axis direction parallel with each other, with respect to a single base part 40. The electrode fingers 302 have the same shape. Each of the electrode fingers 302 has a square cross-sectional shape, and has the same cross-sectional area from the connection part with the base part 40 to the leading end (the same width in the Y-axis direction and the same thickness in the Z-axis direction). Furthermore a thickness (i.e., the height at a part where the side wall of the electrode fingers 302 and the side wall of the electrode fingers 52 face each other in the Z-axis direction) Tm at a part where the electrode fingers 302 and the electrode fingers 52 of the movable electrode 34 overlap in the thickness direction, i.e., the Z-axis direction, is constant.

At the electrode fingers 302 of the fixed electrode 32, at the surface of the part near the connection part with the base part 40 and the part near the leading end, dielectric materials 304, 306 are disposed. The dielectric materials 304, 306 are disposed on both of the side faces of the electrode finger 302 facing the electrode fingers 52 of the movable electrode 34 in the Y-axis direction. The dielectric materials 304, 306 are constituted by a material having high insulation properties or a material having a low Young's modulus or having viscosity, which is different from the material of the main body of the electrode finger 302. The dielectric materials 304, 306 have a relative permittivity that is higher than the relative permittivity of air "1", and have a predetermined thickness $d_1$ the Y-axis direction on the surface of the electrode finger 302.

Note that the dielectric materials 304, 306 may be manufactured by using an organic material such as, for example, a SiO2 film (oxide insulating film) that can be easily deposited by thermally oxidizing silicon, or a resist material. Furthermore, in the following, in the electrode finger 302, the part near the connection part with the base part 40 where the dielectric material 304 is provided is referred to as a root part 302-1, the part near the leading end where the dielectric material 306 is provided is referred to as a leading end part 302-2, and the part in the middle of the root part 302-1 and the leading end part 302-2 is referred to as a middle part 302-3.

The fixed electrode 32 and the movable electrode 34 are disposed such that the base parts 40, 50 face each other in the X-axis direction and the electrode fingers 302 and the electrode fingers 52 face each other and are meshed together in the Y-axis direction. Specifically, the electrode fingers 52 of the movable electrode 34 are disposed so as to enter the center position between two electrode fingers 302 adjacent to each other in the Y-axis direction of the fixed electrode 32. Between the electrode fingers 52 of the movable electrode 34 and the electrode fingers 302 of the fixed electrode 32 adjacent to each other in the Y-axis direction, a predetermined gap $d_0$ is formed in the Y-axis direction at the middle part 302-3 of the electrode finger 302, and a predetermined gap $(d_0-d_1)$ is formed in the Y-axis direction at the root part 302-1 and the leading end part 302-2.

The electrode fingers 52 of the movable electrode 34 are constituted such that the leading ends are positioned, in the X-axis direction, at the center of the middle part 302-3 of the electrode finger 302 of the fixed electrode 32, at the oscillation center (i.e., displacement center of the movable electrode 34) of the structure bodies 16, 18. Furthermore, the length of the middle part 302-3 in the X-axis direction, i.e., the distance in the X-axis direction between the root part 302-1 and the leading end part 302-2 (the distance of the space between one end of the dielectric material 304 and one end of the dielectric material 306 in the X-axis direction) is set to be the same as a value that is two times a target amplitude (i.e., a target displacement amount from the oscillation center of the leading end of the movable electrode 34 corresponding to the target amplitude) A0 of the structure bodies 16, 18, or slightly smaller than this value.

Note that a thickness (i.e., the height at a part where the side wall of the electrode fingers 302 and the side wall of the electrode fingers 52 face each other in the Z-axis direction) Tm at a part where the electrode fingers 302 of the fixed electrode 32 and the electrode fingers 52 of the movable electrode 34 adjacent to each other in the Y-axis direction overlap in the thickness direction, i.e., the Z-axis direction, may be different from the thickness of the electrode fingers 302 in the Z-axis direction or the thickness of the electrode fingers 52 in the Z-axis direction, or may match these thicknesses.

In the displacement amount monitoring electrode 300 having the above structure, in the process (first process) from when the movable electrode 34 is driven/displaced from a position (x=0) where the drive displacement amount x is zero to a position (x=A0) where the drive displacement amount x is the target displacement amount A0, in the fixed electrode 32 facing the movable electrode 34, the middle part 302-3 among the electrode fingers 302 contributes to the increase in the facing area of the fixed electrode 32 and the movable electrode 34. Therefore, in the first process described above, the dielectric constant between the electrode finger 302 of the fixed electrode 32 and the electrode finger 52 of the movable electrode 34 in the Y-axis direction, is a constant value ($=\in 1$) based on the dielectric constant in the space between these electrode fingers, and therefore, the capacitance change amount $\Delta C1$ between the fixed electrode 32 and the movable electrode 34 increases by a constant slope according to the above drive displacement amount x as indicated in the following formula (2). Note that the change amount of the facing area where the fixed electrode 32 and the movable electrode 34 face each other is $\Delta S$.

$$\Delta C1 = \in 1 \cdot \Delta S/d0 \tag{2}$$

Furthermore, in the process (second process) from when the movable electrode 34 is driven/displaced from a position (x=A0) where the drive displacement amount x is the target displacement amount A0 further to the x>A0 side, in the fixed electrode 32 facing the movable electrode 34, the root part 302-1 among the electrode fingers 302 contributes to the increase in the facing area of the fixed electrode 32 and the movable electrode 34. Therefore, in the second process described above, the capacitance change amount $\Delta C2$ between the fixed electrode 32 and the movable electrode 34 is based on the capacitance change amount of the dielectric material 304 and the capacitance change amount of the space between the dielectric material 304 and the electrode finger 52 of the movable electrode 34 in the Y-axis direction, as indicated in the following formula (3), and the capacitance change amount $\Delta C2$ increases by a larger slope compared to the slope of the first process described above, according to the drive displacement amount x described above. Note that the dielectric constant of the space between the electrode finger 302 of the fixed electrode 32 and the electrode finger 52 of the movable electrode 34 is $\in 1$, the dielectric constant of the dielectric material 304 is $\in 2$ ($>\in 1$), and the change amount of the facing area of the fixed electrode 32 and the movable electrode 34 is $\Delta S$.

$$\Delta C2 = \in 1 \cdot 2 \cdot \Delta S/(\in 2 \cdot (d0-d1) + \in 1 \cdot d1) \tag{3}$$

Furthermore, in the process (third process) from when the movable electrode 34 is driven/displaced from the position of x>A0 to the position of x=A0, in the fixed electrode 32 facing the movable electrode 34, the root part 302-1 among the electrode fingers 302 contributes to the decrease in the facing area of the fixed electrode 32 and the movable electrode 34. Therefore, in the third process described above, the capacitance change amount $\Delta C$ between the fixed electrode 32 and the movable electrode 34 decreases by the same slope as the slope of the second process described above, according to the drive displacement amount x described above.

Furthermore, in the process (fourth process) from when the movable electrode 34 is driven/displaced from the position of x=A0 to the position of x=0, and in the process (fifth process) from when the movable electrode 34 is driven/displaced from the position of x=0 to the position of x=−A0, in the fixed electrode 32 facing the movable electrode 34, the middle part 302-3 among the electrode fingers 302 contributes to the decrease in the facing area of the fixed electrode 32 and the movable electrode 34. Therefore, in the fourth and fifth processes described above, the capacitance change amount $\Delta C$ between the fixed electrode 32 and the movable electrode 34 decreases by a smaller slope compared to the slope of the third process described above, according to the drive displacement amount x described above.

Furthermore, in the process (sixth process) from when the movable electrode 34 is driven/displaced from a position (x=−A0) where the drive displacement amount x is the target displacement amount −A0 further to the x<−A0 side, in the fixed electrode 32 facing the movable electrode 34, the leading end part 302-2 among the electrode fingers 302 contributes to the decrease in the facing area of the fixed electrode 32 and the movable electrode 34. Therefore, in the sixth process described above, the capacitance change amount $\Delta C$ between the fixed electrode 32 and the movable electrode 34 is based on the capacitance change amount of the dielectric material 306, and the capacitance change amount of the space between the dielectric material 306 and the electrode finger 52 of the movable electrode 34, and decreases by a larger slope compared to the slope of the fourth and fifth processes described above, according to the drive displacement amount x described above.

Furthermore, in the process (seventh process) from when the movable electrode 34 is driven/displaced from the position of x<−A0 to the position of x=−A0, in the fixed electrode 32 facing the movable electrode 34, the leading end part 302-2 among the electrode fingers 302 contributes to the increase in the facing area of the fixed electrode 32 and the movable electrode 34. Therefore, in the seventh process described above, the capacitance change amount $\Delta C$ between the fixed electrode 32 and the movable electrode 34 increases by the same slope as the slope of the sixth process described above, according to the drive displacement amount x described above.

Furthermore, in the process (eighth process) from when the movable electrode 34 is driven/displaced from the position of x=−A0 to the position of x=0, in the fixed electrode 32 facing the movable electrode 34, the middle part 302-3 among the electrode fingers 302 contributes to the increase in the facing area of the fixed electrode 32 and the movable electrode 34. Therefore, in the eighth process described above, the capacitance change amount $\Delta C$ between the fixed electrode 32 and the movable electrode 34 increases by a smaller slope compared to the slope of the seventh process described above, according to the drive displacement amount x described above.

As described above, the structure of the displacement amount monitoring electrode 300 also has features that when the drive displacement amount x of the movable electrode 34 is between the target displacement amounts −A0 and A0, the change sensitivity of the capacitance change amount AC between the fixed electrode 32 and the movable electrode 34 with respect to the drive displacement amount x of the movable electrode 34 in the X-axis direction is relatively small, while when the drive displacement amount x of the movable electrode 34 satisfies x<−A0 or x>A0, the change sensitivity is relatively large.

That is to say, the structure of the displacement amount monitoring electrode 300 has features that the change sensitivity of the capacitance change amount $\Delta C$ described above becomes higher after the drive displacement of the movable electrode 34 reaches the target displacement amount A0 compared to that before the drive displacement of the movable electrode 34 reaches the target displacement amount A0, and the change sensitivity becomes higher after the drive displacement of the movable electrode 34 reaches the target displacement amount −A0 compared to that before the drive displacement of the movable electrode 34 reaches the target displacement amount −A0. Specifically, the fixed electrode 32 and the movable electrode 34 (particularly, the fixed electrode 32) includes electronic fingers having the dielectric materials 304, 306 provided near the leading end and near the connection part with the base part so that the change sensitivity of the capacitance change amount ΔC described above has the properties described above.

Therefore, also in the structure of the displacement amount monitoring electrode 300, the change sensitivity of the capacitance change amount ΔC between the fixed electrode 32 and the movable electrode 34 with respect to the drive displacement amount x of the movable electrode 34 after the movable electrode 34 is driven/displaced to the target displacement amount A0, −A0, is higher compared to that when the movable electrode 34 is positioned between the target displacement amounts −A0 and A0. Therefore, also in the structure of the displacement amount monitoring electrode 300 according to the present embodiment, the same effects as those of the structure of the displacement amount monitoring electrode 10, 100, 200 according to the first through third embodiments can be achieved.

Furthermore, in the displacement amount monitoring electrode 300, when the dielectric materials 304, 306 are constituted by a material having high insulation properties, in the process where the structure bodies 16, 18 oscillate in the X-axis direction, even if the movable electrode 34 collides with the fixed electrode 32 due to factors such as manufacturing variations, control variations, and excessive stress applied from outside, conduction between the electrodes 32, 34 is prevented by the presence of the dielectric materials 304, 306; therefore, the change in the capacitance between the fixed electrode 32 and the movable electrode 34 can be precisely detected, and erroneous operations can be prevented in exciting the structure bodies 16, 18 toward the semiconductor substrate 14 in the X-axis direction.

Furthermore, in the displacement amount monitoring electrode 300, when the dielectric materials 304, 306 are constituted by a material having a low Young's modulus or having viscosity, even if the movable electrode 34 collides with the fixed electrode 32 due to factors such as manufacturing variations, control variations, and excessive stress applied from outside, the impact applied to the electrodes 32, 34 is absorbed by the presence of the dielectric materials 304, 306; therefore, the fixed electrode 32 and the movable electrode 34 are prevented from breaking.

Incidentally, in the fourth embodiment descried above, the dielectric materials 304, 306 are only provided on the electrode fingers 302 of the fixed electrode 32; however, the present invention is not so limited, and dielectric materials may also be provided on the electrode fingers of the movable electrode 34.

Figure 24:
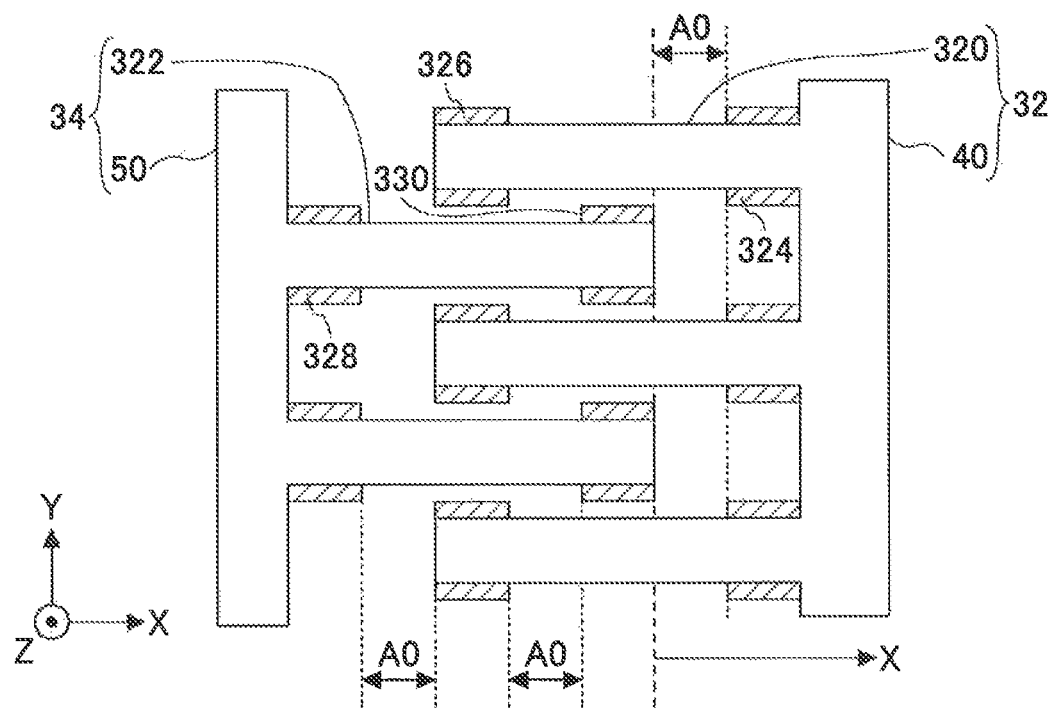
FIG. 24 is a top view of a displacement amount monitoring electrode according to a modification example of the fourth embodiment of the present invention.

For example, as illustrated in FIG. 24, in both electrode fingers 320, 322 of the fixed electrode 32 and the movable electrode 34, dielectric materials 324, 326, 328, 330 may be provided near the connection part with the base part 40, 50 and at the part near the leading end. In the structure of this modification example, the change sensitivity of the capacitance change amount ΔC between the fixed electrode 32 and the movable electrode 34 becomes even higher after the drive displacement of the movable electrode 34 reaches the target displacement amount A0, −A0 compared to the change sensitivity before the drive displacement of the movable electrode 34 reaches the target displacement amount A0, −A0, and therefore the effects can be made even more significant compared to that of the fourth embodiment described above.

Figure 25:
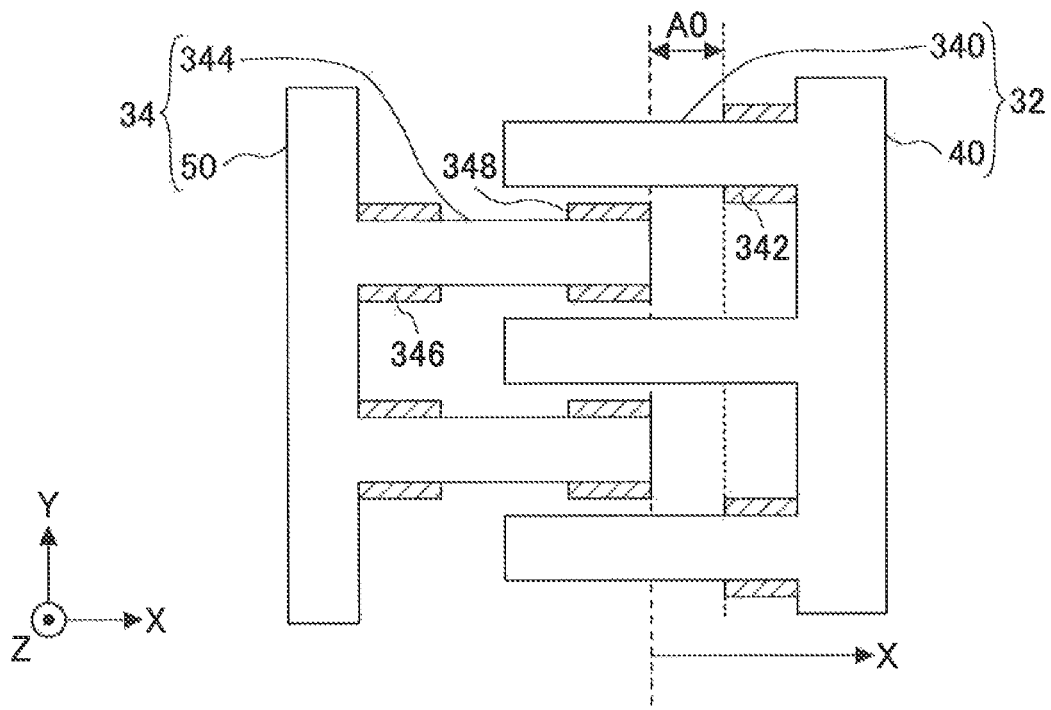
FIG. 25 is a top view of a displacement amount monitoring electrode according to a modification example of the fourth embodiment of the present invention.

Furthermore, as illustrated in FIG. 25, on an electrode finger 340 of the fixed electrode 32, a dielectric material 342 may be provided only at the part near the connection part with the base part 40, and on an electrode finger 344 of the movable electrode 34, dielectric materials 346, 348 may be provided near the connection part with the base part 50 and at a part near the leading end. In the structure of this modification example, the change sensitivity of the capacitance change amount ΔC between the fixed electrode 32 and the movable electrode 34 becomes even higher after the drive displacement of the movable electrode 34 reaches the target displacement amount A0, −A0 compared to the change sensitivity before the drive displacement of the movable electrode 34 reaches the target displacement amount A0, −A0, and therefore the effects can be made even more significant compared to that of the fourth embodiment described above.

Figure 26:
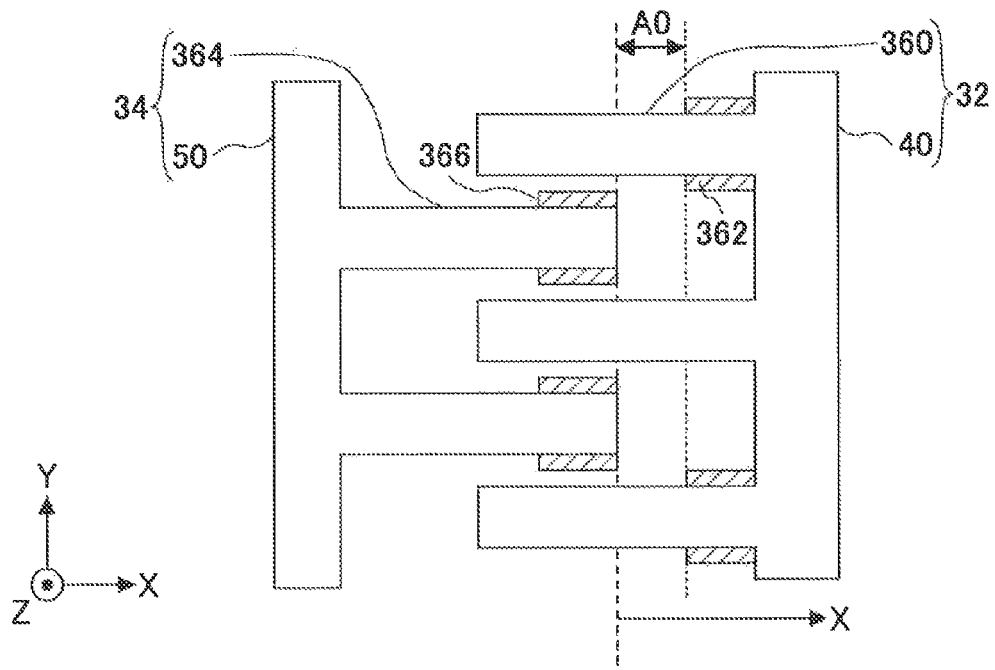
FIG. 26 is a top view of a displacement amount monitoring electrode according to a modification example of the fourth embodiment of the present invention.

Furthermore, as illustrated in FIG. 26, on an electrode finger 360 of the fixed electrode 32, a dielectric material 362 may be provided only at the part near the connection part with the base part 40, and on an electrode finger 364 of the movable electrode 34, a dielectric material 366 may be provided only at the part near the leading end. In the structure of this modification example, the change sensitivity of the capacitance change amount ΔC between the fixed electrode 32 and the movable electrode 34 becomes even higher after the drive displacement of the movable electrode 34 reaches the target displacement amount A0 compared to the change sensitivity before the drive displacement of the movable electrode 34 reaches the target displacement amount A0, and therefore the effects can be made even more significant compared to that of the fourth embodiment described above.

Figure 27:
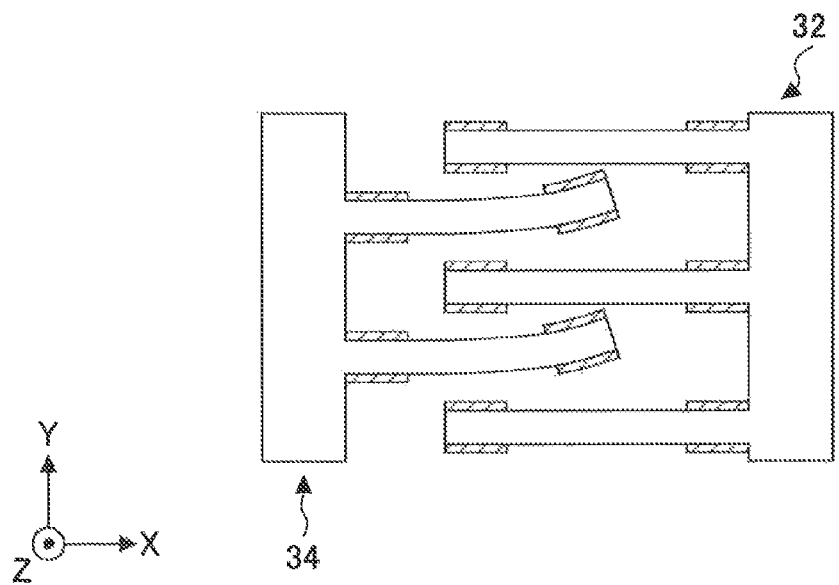
FIG. 27 is for describing the effects of the displacement amount monitoring electrode according to modification examples of the fourth embodiment of the present invention.

Furthermore, also in the structures of the modification examples illustrated in FIGS. 24 through 26 described above, as illustrated in FIG. 27, according to the presence of the dielectric material provided on the fixed electrode 32 and the movable electrode 34, conduction between the electrodes 32, 34 is prevented, and the impact when the electrodes 32, 34 collide can be absorbed, and therefore the same effects as the fourth embodiment described above can be attained.

Furthermore, in the fourth embodiment described above, dielectric materials 304, 306 having a predetermined thickness d1 are provided on the surface of the fixed electrode 32, so that the dielectric constant between the electrode finger 302 of the fixed electrode 32 and the electrode finger 52 of the movable electrode 34 is changed, and the change sensitivity of the capacitance change amount ΔC between the fixed electrode 32 and the movable electrode 34 is changed according to the drive displacement amount of the movable electrode 34; however, the present invention is not so limited.

That is to say, in order to realize the above change sensitivity, the electrode finger 302 of the fixed electrode 32 and the electrode finger 52 of the movable electrode 34 may have a width in the Y-axis direction that does not change from the leading end to the connection part with the base part 40, 50; and the dielectric material to be filled in between the surface of the electrode finger 302 of the fixed electrode 32 and the surface of the electrode finger 52 of the movable electrode 34 may be changed from the leading end to the connection part with the base part 40, 50 so that the dielectric constant between the leading end to the connection part is changed. For example, the dielectric material to be filled in between the surface of the electrode finger 302 of the fixed electrode 32 and the surface of the electrode finger 52 of the movable electrode 34 may be a dielectric material having a relatively high dielectric constant at the parts corresponding to the root part 302-1 and the leading end part 302-2 of the electrode finger 302 of the fixed electrode 32, and meanwhile, the dielectric material may have a relatively low dielectric constant at the part corresponding to the middle part 302-3 of the electrode finger 302.

In this modification example, the dielectric constant between the electrode fingers 302, 52 facing each other in the Y-axis direction becomes larger after the drive displacement of the movable electrode 34 reaches the target displacement amount A0 compared to that before the drive displacement of the movable electrode 34 reaches the target displacement amount A0, and the dielectric constant becomes larger after the drive displacement of the movable electrode 34 reaches the target displacement amount −A0 compared to that before the drive displacement of the movable electrode 34 reaches the target displacement amount −A0.

Thus, also in the structure of this modification example, the change sensitivity of the capacitance change amount ΔC between the fixed electrode 32 and the movable electrode 34 with respect to the drive displacement amount x of the movable electrode 34 after the movable electrode 34 is driven/displaced to the target displacement amount A0, −A0, becomes higher compared to that when the movable electrode 34 is positioned between the target displacement amounts −A0 and A0, and therefore the same effects as the fourth embodiment described above can be achieved.

Furthermore, in the structure of this modification example, unlike the structure of the displacement amount monitoring electrode 10, 100, 300 of the first embodiment, the second embodiment, and the fourth embodiment described above, the electrode finger 302 of the fixed electrode 32 and the electrode finger 52 of the movable electrode 34 has a width in the Y-axis direction that does not change from the leading end to the connection part with the base part 40, 50. Therefore, the gap where the electrode finger 302 of the fixed electrode 32 and the electrode finger 52 of the movable electrode 34 face each other in the Y-axis direction, the gap where the electrode fingers 302 of the fixed electrode 32 are adjacent to each other in the Y-axis direction, and the gap where the electrode fingers 52 of the movable electrode 34 are adjacent to each other in the Y-axis direction, can have a minimum length and can be at equal intervals, and therefore the configuration can be simplified and made compact compared to a structure having unequal gaps, and the area occupied by the displacement amount monitoring electrode 300 on the semiconductor substrate 14 can be prevented from increasing.

Furthermore, in the first through fourth embodiments described above, the displacement amount monitoring electrode 10, 100, 200, 300 is installed in an angular speed sensor 12 for detecting the angular speed; however, the present invention is not so limited, and the displacement amount monitoring electrode may be installed in other sensors as long as they are for monitoring the drive displacement amount of a structural body.

Description of Reference Symbols
10, 28-1, 28-2, 30-1, 30-2, 100, 200, 300 displacement amount monitoring electrode
14 semiconductor substrate
16, 18 structure body
32 fixed electrode
34 movable electrode
40, 50 base part
42, 52, 80, 90, 102, 120, 122, 130, 132, 140, 142, 202, 220, 222, 230, 232, 240, 242, 302, 320, 322, 340, 344, 360, 364 electrode finger
304, 306, 324-330, 342, 346, 348, 362, 366 dielectric material

The invention claimed is:

1. A displacement amount monitoring electrode structure comprising a fixed electrode and a movable electrode each having a comb-teeth shape including a base part and electrode fingers extending from the base part in a predetermined axis direction parallel to a substrate, the fixed electrode and the movable electrode facing each other such that the electrode fingers of the fixed electrode and the electrode fingers of the movable electrode are meshed together, the fixed electrode being fixed to the substrate and the movable electrode being able to be displaced in the predetermined axis direction, wherein the displacement amount monitoring electrode structure monitors a displacement amount of a detection mass to be driven at a target amplitude based on a change amount of a capacitance between the fixed electrode and the movable electrode, wherein a change sensitivity of the change amount of the capacitance with respect to a displacement amount of the movable electrode in the predetermined axis direction, has a characteristic of increasing after the displacement of the movable electrode in the predetermined axis direction reaches a target displacement amount corresponding to the target amplitude, compared to before the displacement of the movable electrode reaches the target displacement amount, and the change sensitivity of the change amount of the capacitance with respect to the displacement amount of the movable electrode from a neutral position in one way of the predetermined axis direction, and the change sensitivity of the change amount of the capacitance with respect to the displacement amount of the movable electrode from the neutral position in another way of the predetermined axis direction, both have the characteristic.

2. The displacement amount monitoring electrode structure according to claim 1, wherein at least one of the fixed electrode and the movable electrode is formed such that a change sensitivity of a total area of areas where the electrode fingers of the fixed electrode and the electrode fingers of the movable electrode face each other at a predetermined distance, becomes larger after the displacement of the movable electrode in the predetermined axis direction reaches the target displacement amount compared to before the displacement of the movable electrode reaches the target displacement amount.

3. The displacement amount monitoring electrode structure according to claim 2, wherein the fixed electrode and the movable electrode are formed such that a number of parts where the electrode fingers of the fixed electrode and the electrode fingers of the movable electrode face each other at a predetermined distance, increases after the displacement of the movable electrode in the predetermined axis direction reaches the target displacement amount compared to before the displacement of the movable electrode reaches the target displacement amount.

4. The displacement amount monitoring electrode structure according to claim 2, wherein at least one of the fixed electrode and the movable electrode is formed such that a length, in a direction perpendicular to the substrate, of areas where the electrode fingers of the fixed electrode and the electrode fingers of the movable electrode face each other at a predetermined distance, becomes longer after the displacement of the movable electrode in the predetermined axis direction reaches the target displacement amount compared to before the displacement of the movable electrode reaches the target displacement amount.

5. The displacement amount monitoring electrode structure according to claim 1, wherein at least one of the fixed electrode and the movable electrode is formed such that a gap where the electrode fingers of the fixed electrode and the electrode fingers of the movable electrode face each other, becomes smaller after the displacement of the movable electrode in the predetermined axis direction reaches the target displacement amount compared to before the displacement of the movable electrode reaches the target displacement amount.

6. The displacement amount monitoring electrode structure according to claim 1, wherein
at least one of the fixed electrode and the movable electrode is formed such that a dielectric constant between the electrode fingers of the fixed electrode and the electrode fingers of the movable electrode facing each other at a predetermined distance, becomes larger after the displacement of the movable electrode in the predetermined axis direction reaches the target displacement amount compared to before the displacement of the movable electrode reaches the target displacement amount.

* * * * *